US009602051B1

(12) United States Patent
Yavorskyy et al.

(10) Patent No.: US 9,602,051 B1
(45) Date of Patent: Mar. 21, 2017

(54) TRANSFORMING VOLTAGE IN A VOLTAGE CONTROLLED OSCILLATOR FOR WIRELESS SENSOR DEVICES

(71) Applicant: Cognitive Systems Corp., Waterloo (CA)

(72) Inventors: Volodymyr Yavorskyy, Waterloo (CA); Tajinder Manku, Waterloo (CA)

(73) Assignee: Cognitive Systems Corp., Waterloo, Ontario (CA)

( * ) Notice: Subject to any disclaimer, the term of this patent is extended or adjusted under 35 U.S.C. 154(b) by 0 days.

(21) Appl. No.: 15/019,480

(22) Filed: Feb. 9, 2016

(51) Int. Cl.
 *H03L 7/00* (2006.01)
 *H03B 5/12* (2006.01)
 *H03D 7/14* (2006.01)

(52) U.S. Cl.
 CPC ........... *H03B 5/1293* (2013.01); *H03B 5/124* (2013.01); *H03B 5/1209* (2013.01); *H03B 5/1212* (2013.01); *H03B 5/1218* (2013.01); *H03B 5/1228* (2013.01); *H03B 5/1243* (2013.01); *H03B 5/1253* (2013.01); *H03B 5/1296* (2013.01); *H03D 7/1458* (2013.01)

(58) Field of Classification Search
 CPC .... H03D 7/1441; H03D 7/125; H03D 7/1458; H04B 1/30; H04B 1/28; H03B 5/1228; H03B 5/1243; H03B 5/1212; H03B 5/1296; H03B 5/124; H03B 27/00; H03B 5/1209; H03B 5/1218; H03B 5/1253; H03B 5/18; H03F 2200/537
 USPC ........ 455/260, 323, 333, 324, 318; 331/167, 331/117 FE, 117 R
 See application file for complete search history.

(56) References Cited

U.S. PATENT DOCUMENTS

| 6,150,893 | A  | 11/2000 | Fattaruso |
| 6,674,333 | B1 | 1/2004 | Peckham et al. |
| 6,778,022 | B1 | 8/2004 | Zhang et al. |
| 6,943,637 | B2 | 9/2005 | Ruffieux |
| 7,075,379 | B2 | 7/2006 | Rana et al. |
| 7,099,643 | B2 | 8/2006 | Lin |
| 7,126,435 | B2 | 10/2006 | Naviasky et al. |

(Continued)

OTHER PUBLICATIONS

United States Patent & Trademark Office; Office Action issued for U.S. Appl. No. 15/019,518 on Oct. 11, 2016; 10 pages; Alexandria, VA; US.

*Primary Examiner* — Arnold Kinkead
(74) *Attorney, Agent, or Firm* — Henry Patent Law Firm PLLC

(57) ABSTRACT

In some aspects, a wireless sensor device includes a voltage controlled oscillator. The voltage controlled oscillator includes a first inverter, a second inverter, and a transformer connected between the first and second inverters. The first inverter includes a first inverter input node and a first inverter output node. The second inverter includes a second inverter input node and a second inverter output node. The transformer includes a primary winding portion, a first secondary winding portion, and a second secondary winding portion. The primary winding portion is connected between the first inverter output node and the second inverter output node and is inductively coupled to the first and second secondary winding portions. The first secondary winding portion is connected between the primary winding portion and the first inverter input node. The second secondary winding portion is connected between the primary winding portion and the second inverter input node.

18 Claims, 15 Drawing Sheets

(56) References Cited

U.S. PATENT DOCUMENTS

| | | |
|---|---|---|
| 7,154,349 B2 | 12/2006 | Cabanillas |
| 7,167,063 B2 | 1/2007 | Yavorskyy et al. |
| 8,169,269 B2 * | 5/2012 | Bao .................... H03B 5/1218 331/117 FE |
| 8,169,270 B2 | 5/2012 | Zeng et al. |
| 2008/0129398 A1 | 6/2008 | Sun et al. |
| 2009/0261917 A1 | 10/2009 | Taghivand et al. |
| 2012/0286888 A1 | 11/2012 | Hsieh et al. |
| 2016/0099681 A1 * | 4/2016 | Zong .................... H03B 5/1212 331/117 FE |

* cited by examiner

TRANSFORMING VOLTAGE IN A VOLTAGE CONTROLLED OSCILLATOR FOR WIRELESS SENSOR DEVICES

BACKGROUND

The following description relates to transforming voltage in a voltage controlled oscillator for wireless sensor devices.

Many wireless devices detect radio frequency (RF) signals and down-convert them to a lower frequency for signal processing. Many wireless devices can also up-convert baseband signals to a higher frequency for signal transmission. The signals can be up-converted or down-converted by a mixer that uses a reference signal from a local oscillator. The local oscillator may include a voltage controlled oscillator that generates the reference signal.

DETAILED DESCRIPTION

The following description relates generally to voltage controlled oscillators (VCOs). The example VCOs described here can be used, for example, in a local oscillator of a wireless sensor device, or in other contexts. In some implementations, the subject matter described here provides advantages, such as, for example, a larger frequency tuning range, better tuning characteristics or others advantages.

In some of the example VCOs described here, an LC (inductor-capacitor) tank oscillator sets the frequency of the reference signal produced by the VCO, and an amplifier circuit compensates the signal losses in the LC tank. The frequency and the phase of the signal generated by the VCO can be maintained, for example, using a Phase Locked Loop (PLL), where the phase and frequency of the signal output by the VCO is compared to an external reference signal. Adjustments to the phase or frequency of the VCO can be initiated by the PLL, for example, via a tuning system that controls the capacitance of the LC tank. When a signal is amplified by the amplifier circuit and filtered by the LC tank, sinusoidal oscillation can grow at the resonance frequency of the LC tank. Oscillation can continue in a steady state, for example, when the amplifier characteristics (gain in units of transconductance) and the LC tank impedance produce a gain greater than unity.

Figure 1:
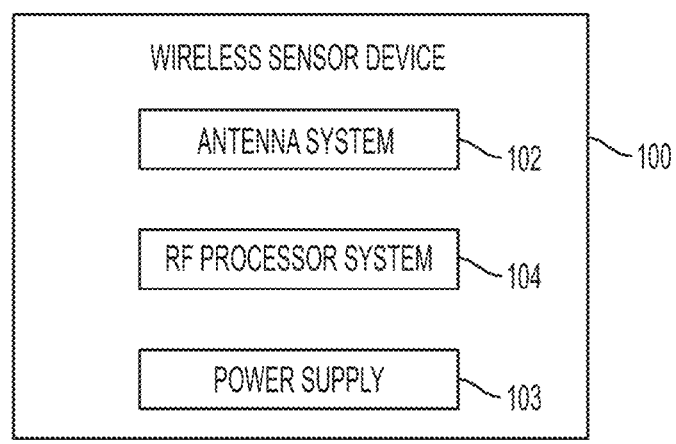
FIG. 1 is a block diagram of an example wireless sensor device.

FIG. 1 is a block diagram showing an example wireless sensor device 100. As shown in FIG. 1, the wireless sensor device 100 includes an antenna system 102, a radio frequency (RF) processor system 104, and a power supply 103. A wireless sensor device may include additional or different features and components, and the components can be arranged as shown or in another manner.

In operation, the wireless sensor device 100 can detect and analyze wireless signals. In some implementations, the wireless sensor device 100 can detect signals exchanged according to a wireless communication standard (e.g., for a cellular network), although the wireless sensor device itself may not be part of the cellular network. In some instances, the wireless sensor device 100 monitors RF signals by "listening" or "watching" for RF signals over a broad range of frequencies and processing the RF signals that it detects. There may be times when no RF signals are detected, and the wireless sensor device 100 may process RF signals (e.g., from time to time or continuously) as they are detected in the local environment of the wireless sensor device 100.

The example antenna system 102 is communicatively coupled with the RF processor system 104, for example, by wires, leads, contacts or another type of coupling that allows the antenna system 102 and the RF processor system 104 to exchange RF signals. In some instances, the antenna system 102 wirelessly receives RF signals from the electromagnetic environment of the wireless sensor device 100 and transfers the RF signals to the RF processor system 104 to be processed (e.g., digitized, analyzed, stored, retransmitted, etc.). In some instances, the antenna system 102 receives RF signals from the RF processor system 104 and wirelessly transmits the RF signals from the wireless sensor device 100.

The example RF processor system 104 can include circuitry that up-converts a baseband signal to an RF signal, that down-converts an RF signal to a baseband signal, or both. Such circuitry can include mixers that utilize a reference signal provided by a local oscillator, which can include a voltage controlled oscillator (VCO). For instance, in some implementations, the RF processor system includes the example VCO 200 shown in FIG. 2, the example VCO 500 shown in FIG. 5 or another type of VCO. In some examples, a baseband signal can be input into a mixer that also receives an RF reference signal from a local oscillator. The mixer can up-convert the baseband signal to an RF signal. In some examples, an RF signal can be input into a mixer that also receives an RF reference signal from a local oscillator. The mixer can down-convert the RF signal to a baseband signal.

The example RF processor system 104 can include one or more chips, chipsets, or other types of devices that are configured to process RF signals. For example, the RF processor system 104 may include one or more processor devices that are configured to identify and analyze data encoded in RF signals by demodulating and decoding the RF signals transmitted according to various wireless communication standards. In some cases, the RF processor system 104 can include one or more digital signal processor (DSP) devices, forward error correction (FEC) devices, and possibly other types of processor devices.

In some implementations, the RF processor system 104 is configured to monitor and analyze signals that are formatted according to one or more communication standards or protocols, for example, 2G standards such as Global System for Mobile (GSM) and Enhanced Data rates for GSM Evolution (EDGE) or EGPRS; 3G standards such as Code Division Multiple Access (CDMA), Universal Mobile Telecommunications System (UMTS), and Time Division Synchronous Code Division Multiple Access (TD-SCDMA); 4G standards such as Long-Term Evolution (LTE) and LTE-Advanced (LTE-A); wireless local area network (WLAN) or WiFi standards such as IEEE 802.11, Bluetooth, near-field communications (NFC), millimeter communications; or multiple of these or other types of wireless communication standards. In some cases, the RF processor system 104 is capable of extracting all available characteristics, synchronization information, cells and services identifiers, quality measures of RF, physical layers of wireless communication standards and other information. In some implementations, the RF processor system 104 is configured to process other types of wireless communication (e.g., non-standardized signals and communication protocols).

In some implementations, the RF processor system 104 can perform various types of analyses in the frequency domain, the time domain, or both. In some cases, the RF processor system 104 is configured to determine bandwidth, power spectral density, or other frequency attributes of detected signals. In some cases, the RF processor system 104 is configured to perform demodulation and other operations to extract content from the wireless signals in the time domain such as, for example, signaling information included in the wireless signals (e.g., preambles, synchronization information, channel condition indicator, SSID/MAC address of a WiFi network). The RF processor system 104 and the antenna system 102 can operate based on electrical power provided by the power supply 103. For instance, the power supply 103 can include a battery or another type of component that provides an AC or DC electrical voltage to the RF processor system 104.

In some cases, the wireless sensor device 100 is implemented as a compact, portable device that can be used to sense wireless signals and analyze wireless spectrum usage. In some implementations, the wireless sensor device 100 is designed to operate with low power consumption (e.g., around 0.1 to 0.2 Watts or less on average). In some implementations, the wireless sensor device 100 can be smaller than a typical personal computer or laptop computer and can operate in a variety of environments. In some instances, the wireless sensor device 100 can operate in a wireless sensor network or another type of distributed system that analyzes and aggregates wireless spectrum usage over a geographic area. For example, in some implementations, the wireless sensor device 100 can be used as described in U.S. Pat. No. 9,143,168, entitled, "Wireless Spectrum Monitoring and Analysis," or the wireless sensor device 100 can be used in another type of environment or operate in another manner.

Figure 2:
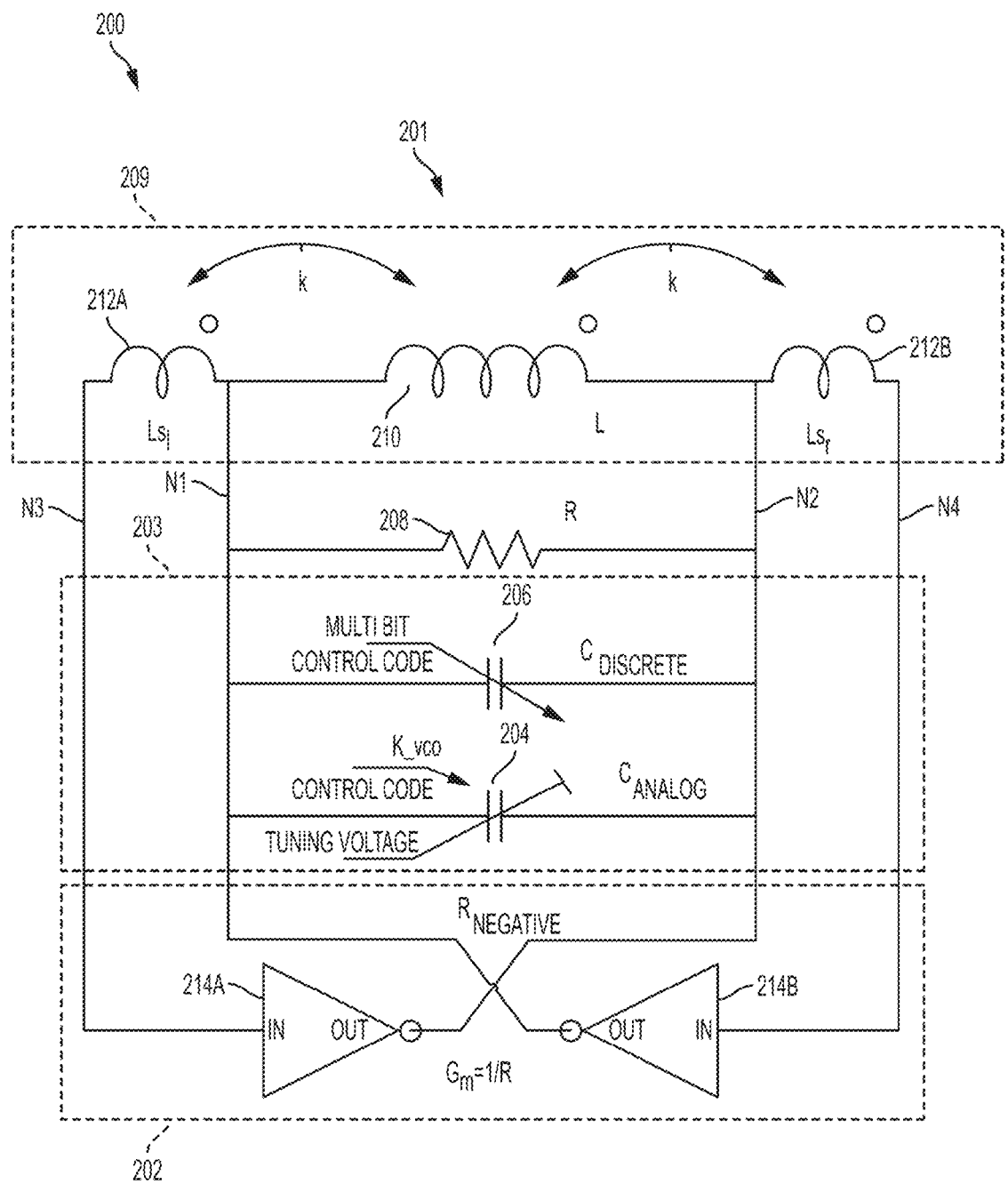
FIG. 2 is a circuit diagram of an example voltage-controlled oscillator (VCO).

FIG. 2 is a circuit diagram of an example voltage-controlled oscillator (VCO) 200. The example VCO 200 can be included, for example, in a local oscillator of a wireless sensor device or another type of wireless device. The example VCO 200 includes a resonator circuit 201, which in this example is an inductor (L)-capacitor (C) oscillator ("LC oscillator"). The example VCO 200 includes an inductive portion, a gain portion 202, and a capacitive portion 203. A VCO may include additional or different features, and the components of a VCO may be arranged as shown or in another manner.

In the example shown in FIG. 2, the inductive portion includes a transformer 209. The example transformer 209 has one or more winding (or coil) structures that include a primary winding portion 210 forming primary inductor L, a first secondary winding portion 212A forming first secondary inductor $L_{sl}$, and a second secondary winding portion 212B forming second secondary inductor $L_{sr}$. The primary winding portion 210 is connected to and between a first node N1 and a second node N2. The first secondary winding portion 212A is connected to and between the first node N1 and a third node N3. The second secondary winding portion 212B is connected to and between the second node N2 and a fourth node N4.

In the example shown, the primary winding portion 210 of the transformer is inductively coupled to each of the first and second secondary winding portions 212A, 212B. In some implementations, the transformer 209 can be an autotransformer, where a single winding (or coil) structure is used as both the primary and secondary winding portions. For example, the primary winding portion 210 and the first and second secondary winding portions 212A, 212B may all be implemented by a single winding structure. In some implementations, the transformer 209 can be implemented as another type of transformer, for example, where the primary winding portion 210 and the first and second secondary winding portions 212A, 212B are each implemented as distinct winding structures.

In the example shown in FIG. 2, a coefficient of coupling k describes the inductive relationship between the primary winding portion 210 and the first secondary winding portion 212A, and an equal coefficient of coupling k describes the inductive relationship between the primary winding portion 210 and the second secondary winding portion 212B. A polarity of the primary winding portion 210 is shown on the side of the primary winding portion 210 connected to the second node N2. A polarity of the first secondary winding portion 212A is shown on the side of the first secondary winding portion 212A connected to the first node N1. A polarity of the second secondary winding portion 212B is shown on the side of the second secondary winding portion 212B connected to the fourth node N4.

The example transformer 209 provides the inductive portion of the resonance circuit 201, and the transformer 209 transforms the voltage input to the bias portion 202 of the VCO 200. In this example, the autotransformer escalates the driving voltage of the inverters 214A, 214B and thereby increases the output current of the inverters 214A, 214B.

In the example shown in FIG. 2, the capacitive portion 203 includes an analog-controlled capacitive element 204 and a digital-controlled capacitive element 206 each connected to and between the first node N1 and the second node N2. As such, in this example, the analog-controlled capacitive element 204 and the digital-controlled capacitive element 206 are in parallel with each other, and they are in parallel with the primary winding portion 210 of the transformer 209. The analog-controlled capacitive element 204 and the digital-controlled capacitive element 206 are configured to tune the frequency of a reference signal output by the VCO 200. The example analog-controlled capacitive element 204 can include analog-tunable capacitors and provide continuous, analog frequency tuning. The example digital-controlled capacitive element 206 can include discretely-controlled capacitors and provide coarse, discrete (or digital) frequency tuning. In some cases, the analog-controlled capacitive element 204 and the digital-controlled capacitive element 206 operate together to provide linear frequency tuning capability.

In the example shown in FIG. 2, the analog-controlled capacitive element 204 can include one or more analog-tunable capacitors that together have the capacitance $C_{ANALOG}$ shown in FIG. 2. For example, the analog-controlled capacitive element 204 can include multiple parallel tunable elements, with each connected to and between the first node N1 and the second node N2. Each tunable element can have one or more variable capacitors or varactors, for example.

In some examples, each tunable element in the analog-controlled capacitive element 204 has a voltage input node for tuning the capacitance value of the tunable element. The voltage input node of each tunable element can be connected to one or more switches for selectively coupling a positive supply voltage (VDD), a negative supply voltage (VSS), or a tuning voltage to the voltage input node. The one or more switches of each tunable element can be controlled by one or more respective bits of the control code K_vco. Additionally, the tunable elements' maximum capacitance values can be weighted, such as by a factor of $2^{N-1}$, where N is the respective tunable element's placement in the order of the tunable elements. For example, where there are six tunable elements, the smallest (e.g., least significant) tunable element can have a maximum capacitance value of $2^0C=C$, and the largest (e.g., most significant) tunable element can have a maximum capacitance value of $2^5C=32C$.

In some examples, each tunable element in the analog-controlled capacitive element 204 can have a single varactor with a weighted maximum capacitance value or multiple varactors in parallel to achieve a weighted maximum capacitance value. In the example where the analog-controlled capacitive element 204 includes six tunable elements, the first (e.g., least significant) tunable element can be a single varactor having a maximum capacitance value of $2^0C=C$; the second tunable element can be a single varactor having a maximum capacitance value of $2^1C=2C$; the third tunable element can be a single varactor having a maximum capacitance value of $2^2C=4C$; the fourth tunable element can be a single varactor having a maximum capacitance value of $2^3C=8C$; the fifth tunable element can be two parallel varactors with each varactor having a maximum capacitance value of $2^3C=8C$, such that the fifth tunable element has a maximum capacitance value of 16C; and the sixth (e.g., most significant) tunable element can be four parallel varactors with each varactor having a maximum capacitance value of $2^3C=8C$, such that the sixth tunable element has a maximum capacitance value of 32C. Another tunable capacitance arrangement can be used in the analog-controlled capacitive element 204.

Further in the example shown, the digital-controlled capacitive element 206 can include one or more discrete capacitors that together have the capacitance $C_{DISCRETE}$ shown in FIG. 2. The discrete capacitors can be coupled to the resonator circuit in a closed loop configuration, for instance, using one or more controllable switches. For example, the digital-controlled capacitive element 206 can include multiple capacitive elements, with each connected between the first node N1 and the second node N2. In this example, each capacitive element in the digital-controlled capacitive element 206 has a fixed capacitance that can be individually activated or de-activated in the resonance circuit 201 to increase or decrease the capacitance $C_{DISCRETE}$. As such, in this example, the capacitive elements in the digital-controlled capacitive element 206 are not individually tuned, but rather, the capacitive elements in the digital-controlled capacitive element 206 are individually switched on or off, for example, as described with respect to FIGS. 9, 10, 11 and 12.

In some examples, each capacitive element in the digital-controlled capacitive element 206 can include one or more capacitors, and a switch in the capacitive element can selectively couple the one or more capacitors to other elements. For example, a switch may be arranged to selectively couple a capacitor to the first node N1 and the second node N2, to the first node N1 and a power supply node (e.g., VSS), to the second node N2 and a power supply node (e.g., VSS), or otherwise. In the example shown, the switch of each capacitive element can be controlled by a multiunit control code.

In some implementations, the respective capacitance values of the capacitive elements in the digital-controlled capacitive element 206 are weighted by a factor. For example, the capacitance values can be weighted by a factor of $2^{N-1}$, where N is the respective capacitive element's placement in an array. In some implementations, each capacitive element includes a single capacitor with the weighted capacitance value, or each capacitive element includes multiple capacitors in parallel to achieve the weighted capacitance value. Example arrangements of capacitive elements in a digital-controlled capacitive element are described with respect to FIGS. 9 through 12. These or other arrangements of discrete capacitors can be used in the example digital-controlled capacitive element 206.

In the example shown in FIG. 2, the gain portion 202 of the VCO 200 includes a first inverter 214A and a second inverter 214B. An input (labeled "IN") of the first inverter 214A is connected to the third node N3, and an output (labeled "OUT") of the first inverter 214A is connected to the second node N2. An input (labeled "IN") of the second inverter 214B is connected to the fourth node N4, and an output (labeled "OUT") of the second inverter 214B is connected to the first node N1. The first and second inverters 214A, 214B in FIG. 2 can be implemented according to the example inverter 300 shown in FIG. 3, or another type of inverter may be used.

In the example shown in FIG. 2, a resistive element 208 having a resistance R is shown connected to and between the first node N1 and the second node N2. In the example shown, the resistive element 208 represents an inherent resistance in the various components of the VCO 200. As shown in FIG. 2, the gain portion 202 provides an effective negative resistance $R_{NEGATIVE}$ in the VCO 200 to offset the resistance R. The effective negative resistance $R_{NEGATIVE}$ is produced by the transconductance $G_m=1/R$ of the example gain portion 202.

In some aspects of operation, the first and second inverters 214A and 214B each realize an output current that is equal to the input voltage received by the inverter times the inverter's transconductance. For example, each inverter may produce an output current $i_{out}=g_m v_{in}$, where $i_{out}$ represents the output current of the inverter, $g_m$ represents the transconductance of the inverter, and $v_{in}$ represents the input voltage of the inverter. Using the first inverter 214A in FIG. 2 as an example, in some instances, the input voltage $v_{in}$ is equal to the third node (N3) voltage $v_{N3}$ (e.g., $v_{in}=v_{N3}$), and due to the presence of the transformer 209, the third node (N3) voltage $v_{N3}$ is equal to the first node (N1) voltage $v_{N1}$ times a proportionality coefficient b (e.g., $v_{N3}=bv_{N1}$). The first node (N1) voltage $v_{N1}$ can also be referred to as a tank voltage $v_{tank}$.

In some implementations, the proportionality coefficient b, which is the ratio of the third node (N3) voltage $v_{N3}$ to the first node (N1) voltage $v_{N1}$, can be estimated, for instance, by voltage division across the transformer 209. For example, in some cases, the proportionality coefficient b can be estimated as $$b = \frac{L + L_S + 2M}{L} = 1 + \frac{L_S + 2M}{L}.$$

According to this estimation, the proportionality coefficient b is greater than 1. By substitution into $i_{out}=g_m v_{in}$, $i_{out}=bg_m v_{N1}$ (or $i_{out}=bg_m v_{tank}$), and the effective transconductance as seen by the LC tank (e.g., $(i_{out}/v_{tank})=bg_m$) is greater (by a factor of the proportionality coefficient b) than if the input of the inverter were connected directly to the tank voltage at the first node (N1).

In some instances, by having an increased effective transconductance as seen by the LC tank, additional losses in the LC tank can be compensated by the gain portion 202 of the VCO 200, which can provide a greater tuning range of the VCO 200. For example, by compensating additional losses, more capacitors can be included in the LC tank, which can increase the oscillation frequency tuning range of the VCO 200. More capacitors in the LC tank can lead to more losses due to the inherent resistance of the capacitors; and when losses are greater than what can be compensated by the gain portion 202 (by the effective transconductance seen by the LC tank), the LC tank may not oscillate at steady state. But a greater effective transconductance can compensate for the losses and allow the LC tank to oscillate at a steady state, in some instances.

Figure 3:
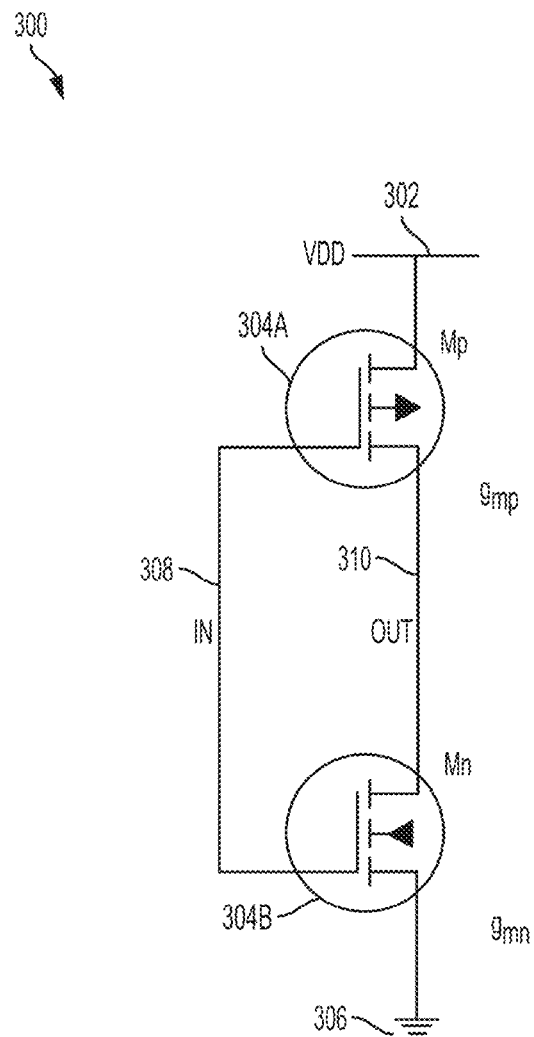
FIG. 3 is a circuit diagram of an example inverter.

FIG. 3 is a circuit diagram of an example inverter 300. The inverter 300 shown in FIG. 3 is an example of a complementary field effect transistor (e.g., Complementary Metal Oxide Semiconductor (CMOS)) inverter that can be used to implement each of the first and second inverters 214A, 214B in FIG. 2. For example, the nodes labeled "IN" and "OUT" in FIG. 3 may correspond to the nodes labeled "IN" and "OUT" in either of the inverters shown in FIG. 2.

The example inverter 300 shown in FIG. 3 includes a p-type transistor (e.g., a p-type Metal Oxide Semiconductor Field Effect Transistor (MOSFET)) 304A and an n-type transistor (e.g., an n-type MOSFET) 304B. The gates of the p-type transistor 304A and the n-type transistor 304B are connected together and form an input node 308 (labeled "IN"). A source of the p-type transistor 304A is connected to a positive power supply node 302 (e.g., VDD), and a source of the n-type transistor 304B is connected to a negative power supply node 306 (e.g., ground or VSS). The drains of the p-type transistor 304A and the n-type transistor 304B are connected together and form an output node 310 (labeled "OUT").

Figure 4:
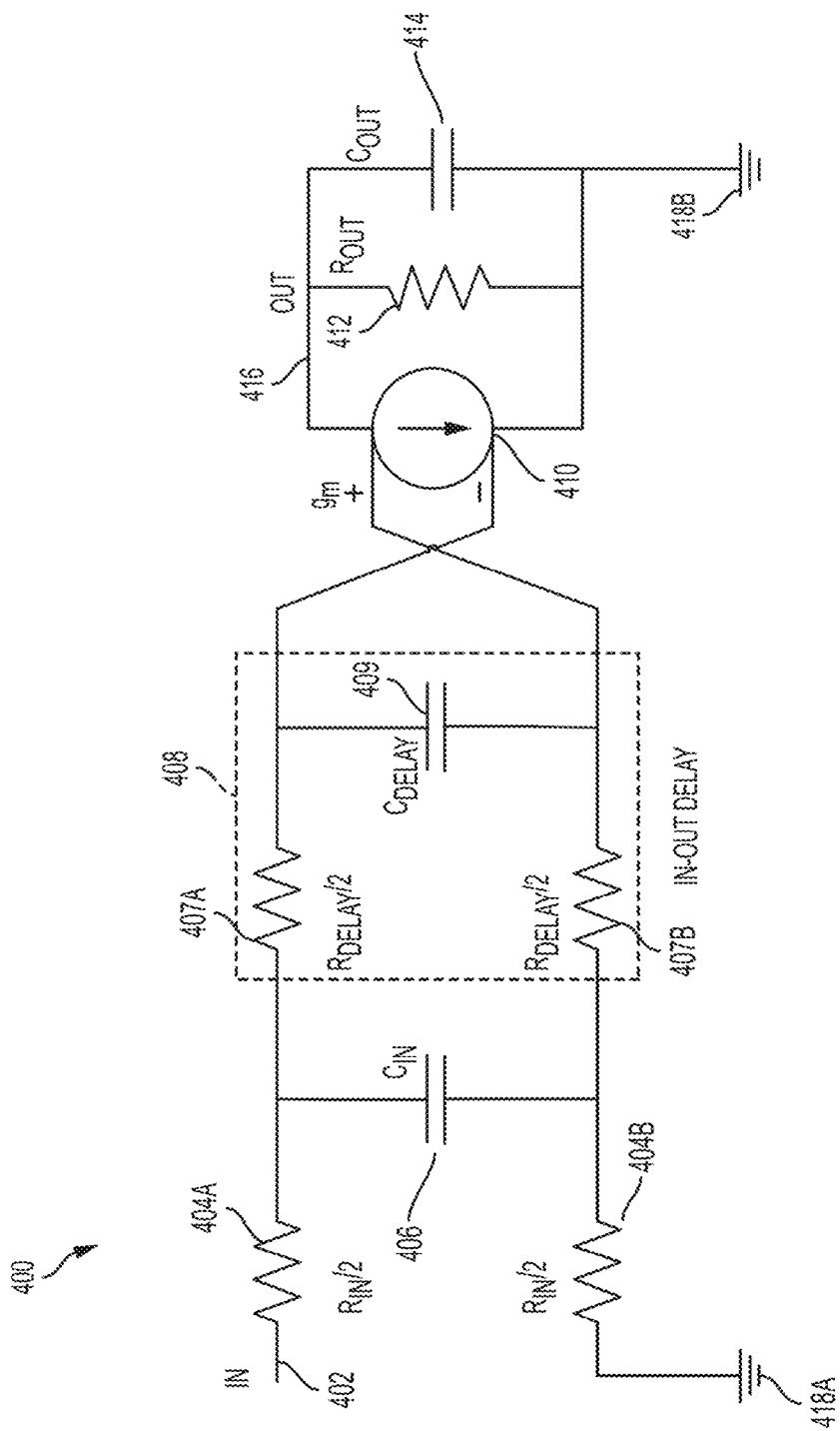
FIG. 4 is a small signal circuit representation of the example inverter of FIG. 3.

FIG. 4 is a small signal circuit representation 400 of the example inverter 300 of FIG. 3. In some instances, the example small signal circuit representation 400 can represent the first inverter 214A or the second inverter 214B shown in FIG. 2. For example, the nodes labeled "IN" and "OUT" in FIG. 4 may correspond to the nodes labeled "IN" and "OUT" in either of the inverters shown in FIG. 2.

As shown in FIG. 4, a first node of a first input resistor 404A is connected to an input node 402 (labeled "IN"). A second node (opposite the first node) of the first input resistor 404A is connected to a first node of an input capacitor 406 and a first node of a first delay resistor 407A. A second node (opposite the first node) of the first delay resistor 407A is connected to a first node of a delay capacitor 409. A second node (opposite the first node) of the delay capacitor 409 is connected to a first node of a second delay resistor 407B. A second node (opposite the first node) of the second delay resistor 407B is connected to a second node (opposite the first node) of the input capacitor 406 and a first node of a second input resistor 404B. A second node (opposite the first node) of the second input resistor 404B is coupled to ground (or VSS) 418A. As shown in FIG. 4, a transconductance 410, an output resistor 412, and an output capacitor 414 are connected in parallel between an output node 416 (labeled "OUT") and ground (or VSS) 418B.

In the example shown in FIG. 4, the first and second input resistors 404A and 404B each have a resistance $R_{IN}/2$. The first and second delay resistors 407A and 407B each have a resistance $R_{DELAY}/2$. The input capacitor 406 has a capacitance $C_{IN}$, and the delay capacitor 409 has a capacitance $C_{DELAY}$. The first delay resistor 407A, the delay capacitor 409, and the second delay resistor 407B constitute an example in-out delay element 408. Input nodes of the example in-out delay element 408 are the first node of the first delay resistor 407A and the second node of the second delay resistor 407B. Output nodes of the example in-out delay element 408 are the first node of the delay capacitor 409 (which is also the second node of the first delay resistor 407A) and the second node of the delay capacitor 409 (which is also the first node of the second delay resistor 407B). The transconductance 410 has a current value based on the negative voltage across the delay capacitor 409, such that the current can be expressed $(-g_m v_c)$, where $v_c$ represents the voltage drop on the delay capacitor 409. The output resistor 412 has a resistance $R_{OUT}$, and the output capacitor 414 has a capacitance $C_{OUT}$.

Figure 5:
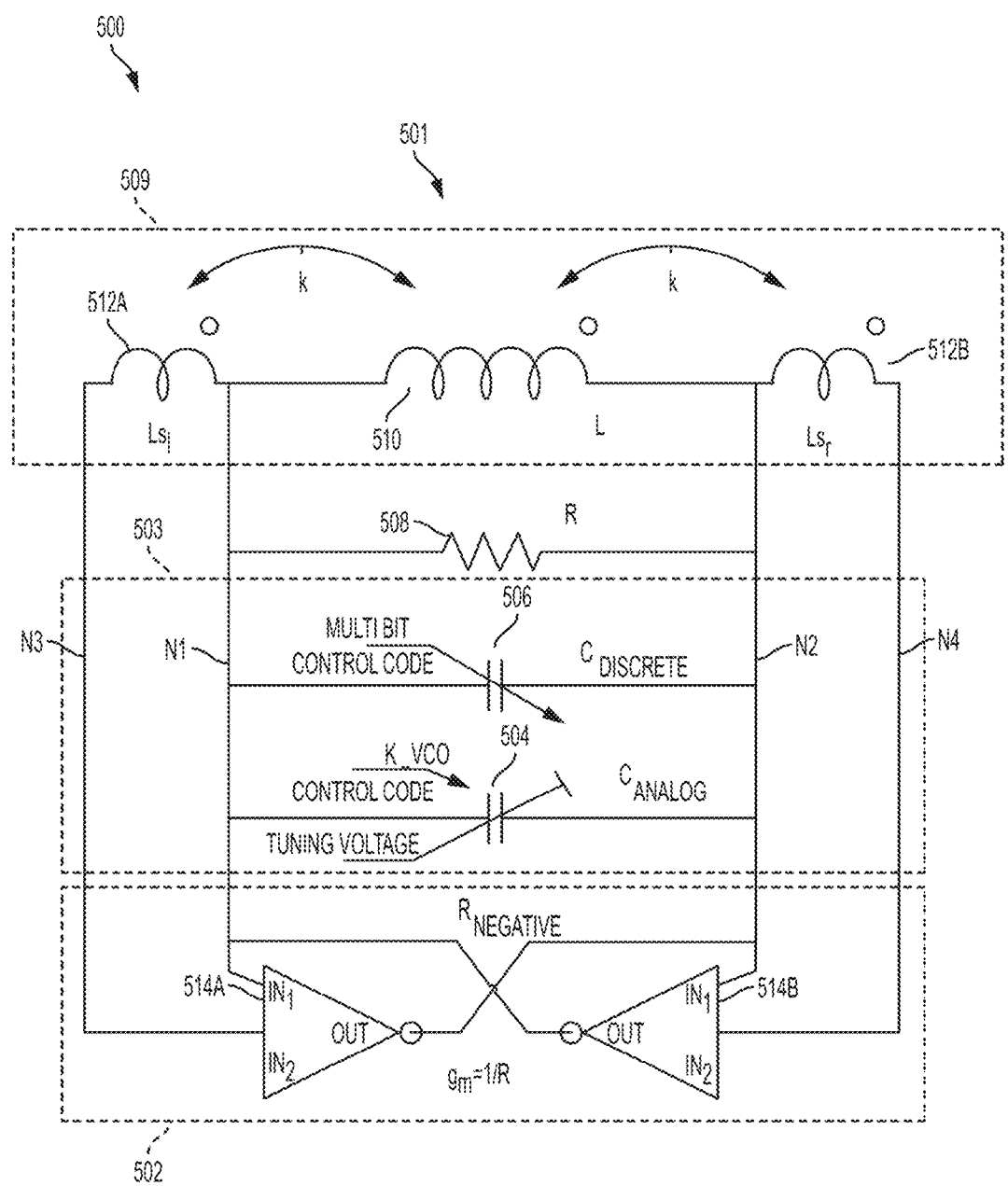
FIG. 5 is a circuit diagram of an example VCO.

FIG. 5 is a circuit diagram of an example VCO 500. The example VCO 500 can be included, for example, in a local oscillator of a wireless sensor device or another type of wireless device. The example VCO 500 includes a resonator circuit 501, which in this example is an LC oscillator. The example VCO 500 includes an inductive portion, a gain portion 502, and a capacitive portion 503. A VCO may include additional or different features, and the components of a VCO may be arranged as shown or in another manner.

In the example shown in FIG. 5, the inductive portion includes a transformer 509, which in this example is an autotransformer. The example transformer 509 has a winding (or coil) structure that includes a primary winding portion 510 forming primary inductor L, a first secondary winding portion 512A forming first secondary inductor $L_{sl}$, and a second secondary winding portion 512B forming second secondary inductor $L_{sr}$. The primary winding portion 510 is connected to and between a first node N1 and a second node N2. The primary winding portion 510 is also connected to and between a third node N3 and a fourth node N4. The first secondary winding portion 512A is connected to and between the first node N1 and the third node N3. The second secondary winding portion 512B is connected to and between the second node N2 and the fourth node N4.

In the example shown, the primary winding portion 510 of the transformer is inductively coupled to each of the first and second secondary winding portions 512A, 512B. In some implementations, the transformer 509 can be an autotransformer, where a single winding (or coil) is used as both the primary and secondary winding portions. For example, the primary winding portion 510 and the first and second secondary winding portions 512A, 512B may all be implemented as a single winding structure. In some implementations, the transformer 509 can be implemented as another type of transformer, for example, where the primary winding portion 510 and the first and second secondary winding portions 512A, 512B are each implemented as distinct winding structures.

In the example shown in FIG. 5, a coefficient of coupling k describes the inductive relationship between the primary winding portion 510 and the first secondary winding portion 512A, and an equal coefficient of coupling k describes the inductive relationship between the primary winding portion 510 and the second secondary winding portion 512B. A polarity of the primary winding portion 510 is shown on the side of the primary winding portion 510 connected to the second node N2. A polarity of the first secondary winding portion 512A is shown on the side of the first secondary winding portion 512A connected to the first node N1. A polarity of the second secondary winding portion 512B is shown on the side of the second secondary winding portion 512B connected to the fourth node N4.

The example transformer 509 provides the inductive portion of the resonance circuit 501, and the transformer 509 transforms the voltage input to the bias portion 502 of the VCO 500. In this example, the autotransformer escalates the driving voltage of the inverters 514A, 514B and thereby increases the output current of the inverters 514A, 514B.

In the example shown in FIG. 5, the capacitive portion 503 includes an analog-controlled capacitive element 504 and a digital-controlled capacitive element 506 each connected to and between the first node N1 and the second node N2. As such, in this example, the analog-controlled capacitive element 504 and the digital-controlled capacitive element 506 are in parallel with each other, and they are in parallel with the primary winding portion 510 of the transformer 509. The analog-controlled capacitive element 504 and the digital-controlled capacitive element 506 are configured to tune the frequency of a reference signal output by the VCO 500. The example analog-controlled capacitive element 504 can include analog-tunable capacitors and provide continuous, analog frequency tuning. The example digital-controlled capacitive element 506 can include discretely-controlled capacitors and provide coarse, discrete (or digital) frequency tuning. In some cases, the analog-controlled capacitive element 504 and the digital-controlled capacitive element 506 operate together to provide linear frequency tuning capability. The analog-controlled capacitive element 504 and the digital-controlled capacitive element 506 can be configured and may operate as the analog-controlled capacitive element 204 and the digital-controlled capacitive element 206, respectively, in FIG. 2.

In the example shown in FIG. 5, the gain portion 502 of the VCO 500 includes a first inverter 514A and a second inverter 514B; each of the inverters 514A, 514B has two inputs. A first input (labeled "IN$_1$") of the first inverter 514A is connected to the first node N1, and a second input (labeled "IN$_2$") of the first inverter 514A is connected to the third node N3. An output (labeled "OUT") of the first inverter 514A is connected to the second node N2. A first input (labeled "IN$_1$") of the second inverter 514B is connected to the second node N2, and a second input (labeled "IN$_2$") of the second inverter 514B is connected to the fourth node N4. An output (labeled "OUT") of the second inverter 514B is connected to the first node N1. The first and second inverters 514A, 514B in FIG. 5 can be implemented according to the example inverter 700 shown in FIG. 7 or according to the example inverter 800 shown in FIG. 8, or another type of inverter may be used.

In the example shown in FIG. 5, a resistive element 508 having a resistance R is shown connected to and between the first node N1 and the second node N2. In the example shown, the resistive element 508 represents an inherent resistance in the various components of the VCO 500. As shown in FIG. 5, the gain portion 502 provides an effective negative resistance $R_{NEGATIVE}$ in the VCO 500 to offset the resistance R. The effective negative resistance $R_{NEGATIVE}$ is produced by the transconductance $G_m=1/R$ of the example gain portion 502.

In some implementations, configuring the inverters 514A, 514B to receive two input signals, as shown in FIG. 5, can provide advantages in the example VCO 500. For example, in an inverter that has two input nodes, smaller transistors may be used without significantly adversely impacting the effective transconductance of the inverter. By using smaller transistors, the small signal input capacitance values can be decreased, which in turn can lower the low end of an oscillating frequency tuning range of the VCO. In some instances, this can increase the total tuning range to which an output oscillation signal frequency can be tuned.

Figure 6:
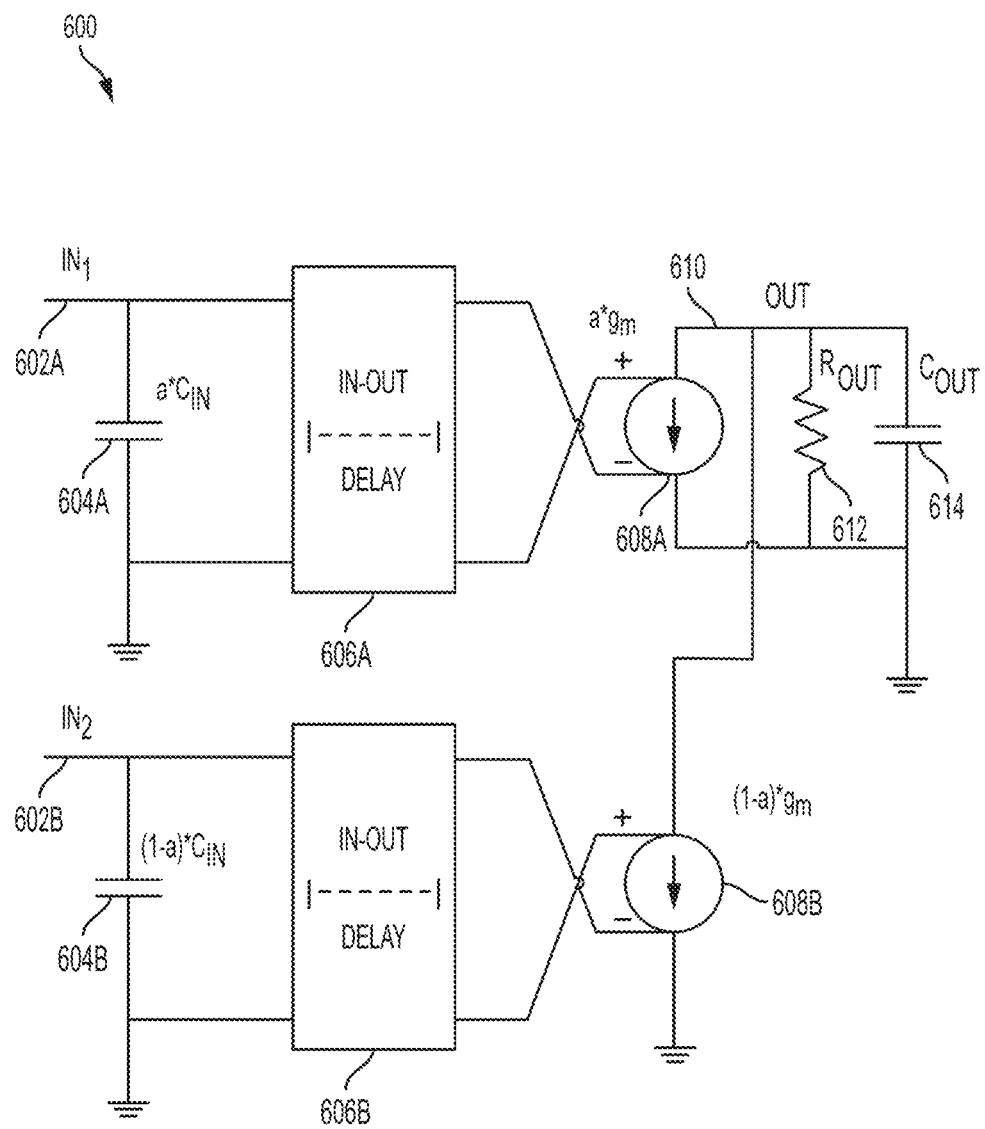
FIG. 6 is a small signal circuit representation of an example inverter having two input nodes.

FIG. 6 is a small signal circuit representation 600 of an example inverter having two input nodes. In some instances, the example small signal circuit representation 600 can represent the first inverter 514A or the second inverter 514B. For example, the nodes labeled "IN$_1$", "IN$_2$" and "OUT" in FIG. 6 may correspond to the nodes labeled "IN$_1$", "IN$_2$" and "OUT" in either of the inverters shown in FIG. 5.

As shown in FIG. 6, by having split inputs, the input capacitance of the inverter is split between the inputs. In this example, a first input node 602A (labeled "IN$_1$") is connected to a first node of a first input capacitor 604A and to a first input node of a first in-out delay element 606A. A second node (opposite the first node) of the first input capacitor 604A and a second input node of the first in-out delay element 606A are connected to ground (or VSS). A second input node 602B (labeled "IN$_2$") is connected to a first node of a second input capacitor 604B and to a first input node of a second in-out delay element 606B. A second node (opposite the first node) of the second input capacitor 604B and a second input node of the second in-out delay element 606B are connected to ground (or VSS). The example in-out delay elements 606A, 606B shown in FIG. 6 can be implemented as the example in-out delay element 408 shown in FIG. 4 or in another manner.

In the example shown in FIG. 6, a first transconductance 608A, a second transconductance 608B, an output resistor 612, and an output capacitor 614 are connected in parallel between an output node 610 (labeled "OUT") and ground (or VSS). The first transconductance 608A is tied to a voltage in the first in-out delay element 606A, and the second transconductance 608B is tied to a voltage in the second in-out delay element 606B. In the example shown, values of components relating or tied to the first input 602A are scaled by a scaling factor $\alpha$, and values of components relating or tied to the second input 602B are scaled by an inverse scaling factor $(1-\alpha)$. The scaling factor $\alpha$ can be a number between 0 and 1, e.g., $0<\alpha<1$.

As shown in FIG. 6, the first input capacitor 604A has a capacitance $\alpha C_{IN}$, and the second input capacitor 604B has a capacitance $(1-\alpha)C_{IN}$. The first transconductance 608A has a current value based on the negative voltage across the delay capacitor of the first in-out delay element 606A, such that the current can be expressed $(-\alpha g_m v_c)$, and the second transconductance 608B has a current value based on the negative voltage across the delay capacitor of the second in-out delay element 606B, such that the current can be expressed $(-(1-\alpha) g_m v_c)$. The output resistor 612 has a resistance $R_{OUT}$, and the output capacitor 614 has a capacitance $C_{OUT}$.

Figure 7:
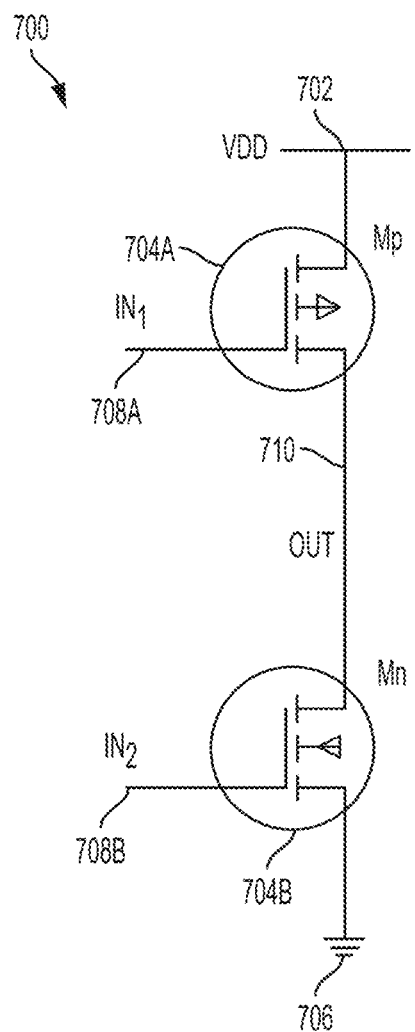
FIG. 7 is a circuit diagram of an example inverter having two input nodes.

FIG. 7 is a circuit diagram of an example inverter 700 having two input nodes. In some instances, the example inverter 700 can be used to implement each of the first inverter 514A and the second inverter 514B in FIG. 5. For example, the nodes labeled "$IN_1$", "$IN_2$" and "OUT" in FIG. 7 may correspond to the nodes labeled "$IN_1$", "$IN_2$" and "OUT" in either of the inverters shown in FIG. 5.

The example inverter 700 includes a p-type transistor 704A (e.g., an p-type MOSFET) and an n-type transistor 704B (e.g., an n-type MOSFET). The gate of the p-type transistor 704A is connected to the first input node 708A (labeled "$IN_1$"), and the gate of the n-type transistor 704B is connected to the second input node 708B (labeled "$IN_2$"). A source of the p-type transistor 704A is connected to a positive power supply node 702 (e.g., VDD), and a source of the n-type transistor 704B is connected to a negative power supply node 706 (e.g., ground or VSS). The drains of the p-type transistor 704A and the n-type transistor 704B are connected together and form an output node 710 (labeled "OUT").

Figure 8:
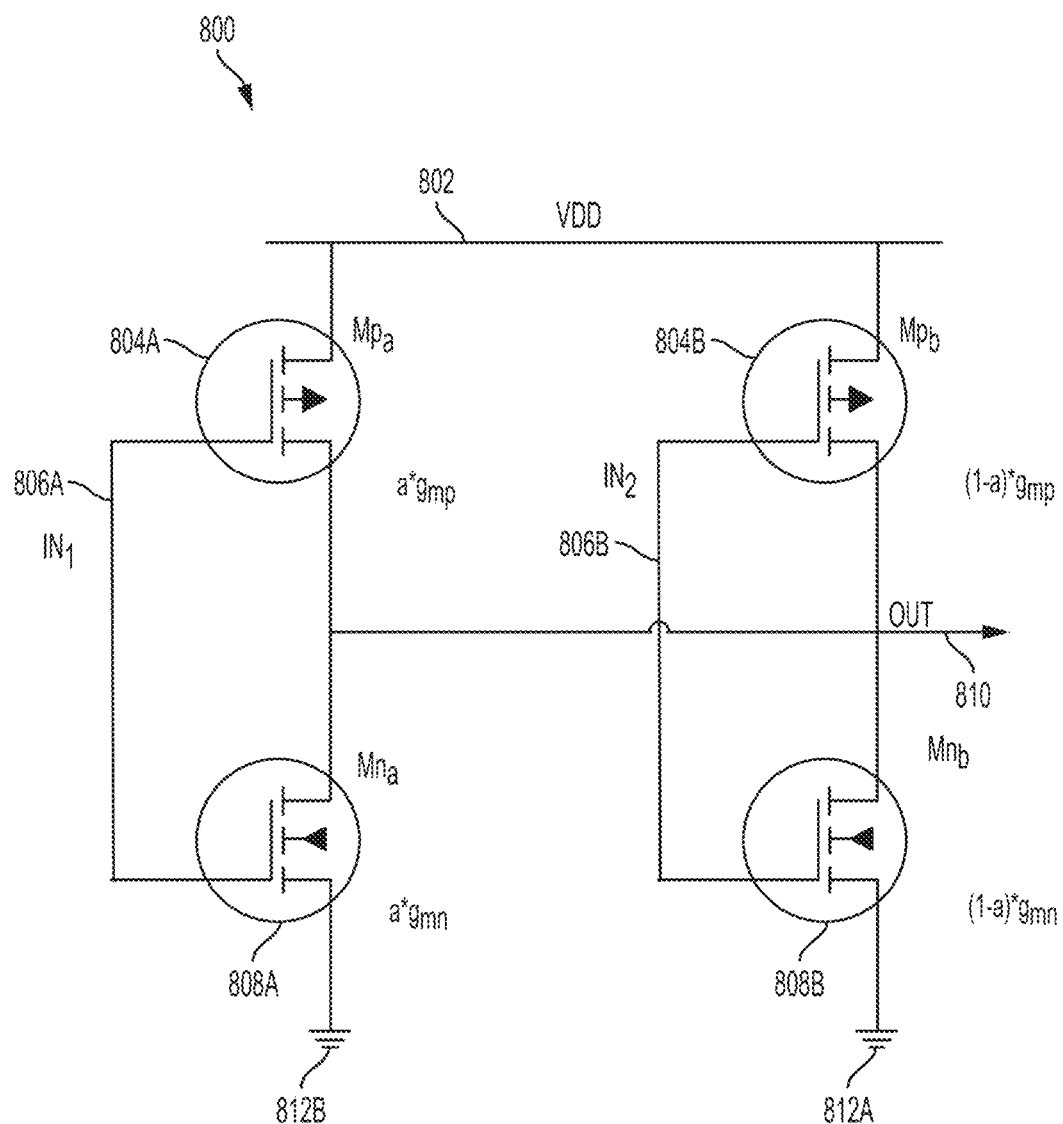
FIG. 8 is a circuit diagram of another example inverter having two input nodes.

FIG. 8 is a circuit diagram of an example inverter 800 having two input nodes. In some instances, the example inverter 800 can be used to implement each of the first inverter 514A and the second inverter 514B in FIG. 5. For example, the nodes labeled "$IN_1$", "$IN_2$" and "OUT" in FIG. 8 may correspond to the nodes labeled "$IN_1$", "$IN_2$" and "OUT" in either of the inverters shown in FIG. 5.

The example inverter 800 includes a first p-type transistor 804A (e.g., a p-type MOSFET), a second p-type transistor 804B (e.g., a p-type MOSFET), a first n-type transistor 808A (e.g., an n-type MOSFET), and a second n-type transistor 808B (e.g., an n-type MOSFET). The gates of the first p-type transistor 804A and the first n-type transistor 808A are connected together and form a first input node 806A (labeled "$IN_1$"). A source of the first p-type transistor 804A is connected to a positive power supply node 802 (e.g., VDD), and a source of the first n-type transistor 808A is connected to a negative power supply node 812B (e.g., ground or VSS). The gates of the second p-type transistor 804B and the second n-type transistor 808B are connected together and form a second input node 806B (labeled "$IN_2$"). A source of the second p-type transistor 804B is connected to a positive power supply node 802 (e.g., VDD), and a source of the second n-type transistor 808B is connected to a negative power supply node 812A (e.g., ground or VSS). The drains of the first p-type transistor 804A, the first n-type transistor 808A, the second p-type transistor 804B, and the second n-type transistor 808B are connected together and form an output node 810 (labeled "OUT").

Figure 9:
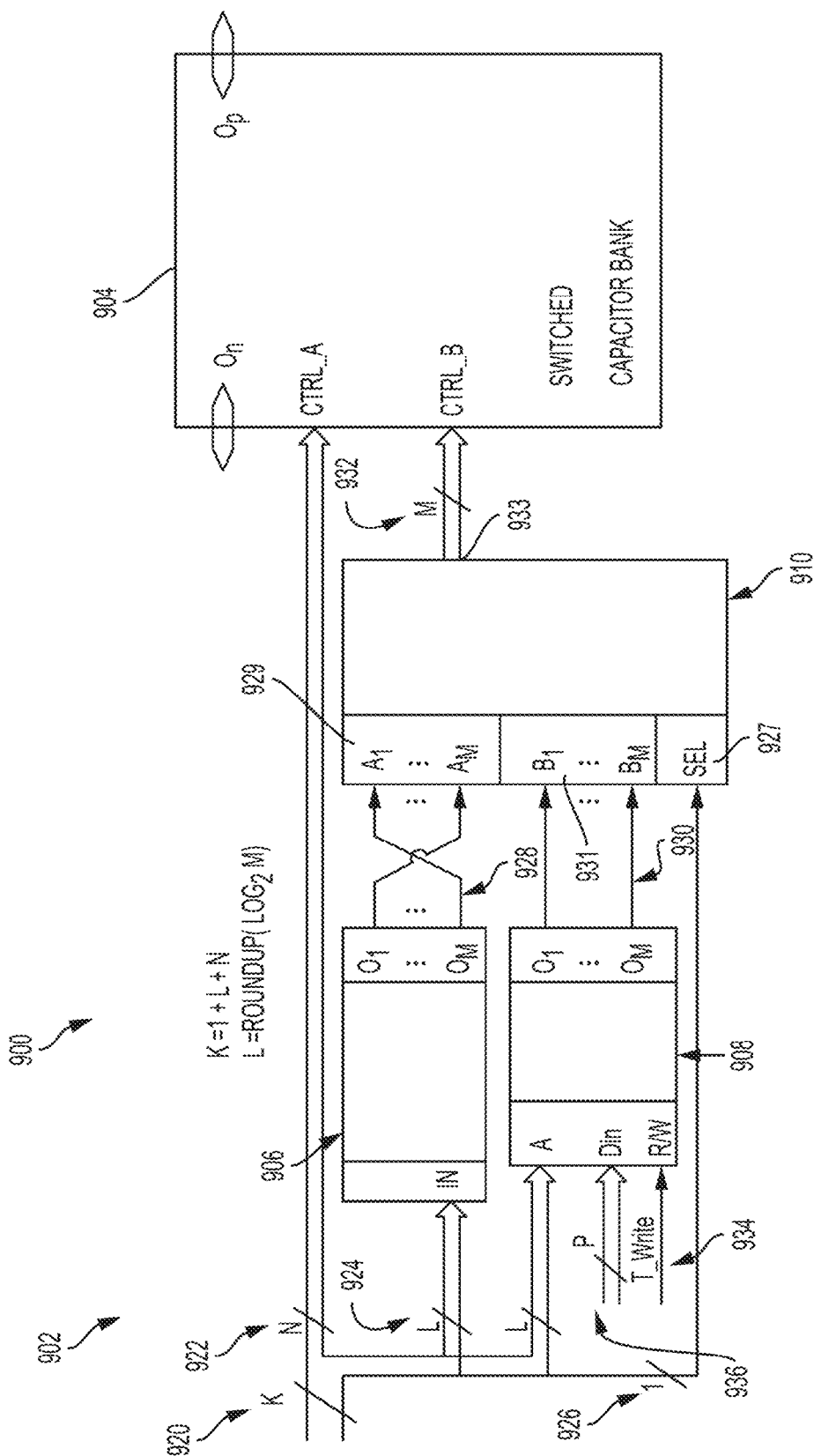
FIG. 9 is a diagram of an example coarse tuning system.

FIG. 9 is a diagram of an example coarse tuning system 900. The example coarse tuning system 900 shown in FIG. 9 includes a switched capacitor bank (SCB) 904 and control logic 902 that controls the SCB 904. The control logic 902 includes a binary-to-thermometer (BtT) decoder 906, a lookup table (LUT) 908 and a multiplexer 910. A coarse tuning system may include additional or different features, and the components may be configured as shown in FIG. 9 or in another manner.

In some implementations, the coarse tuning system 900 can be included in a voltage controlled oscillator (VCO), for example, to tune a resonator circuit in the VCO. For instance, all or part of the coarse tuning system 900 may be included in or operate in connection with the example VCO 200 shown in FIG. 2, the VCO 500 shown in FIG. 5 or another type of VCO. In some cases, the coarse tuning system 900 is operable to tune the resonator circuit by controlling a capacitive portion the resonator circuit. For example, in some instances, the resonator circuit may be tuned by modifying (increasing or decreasing) the digital-controlled capacitive element in the resonator circuit.

In some implementations, the coarse tuning system 900 includes capacitive elements that are connected as the digital-controlled capacitive element of a resonator circuit in a VCO. For instance, the capacitive elements in the SCB 904 can be connected in a resonator circuit as the digital-controlled capacitive element 206 in the example VCO 200 shown in FIG. 2 or as the digital-controlled capacitive element 506 in the example VCO 500 shown in FIG. 5. In some cases, the K-bit input signal 920 shown in FIG. 9 corresponds to the multi-bit control code shown in FIG. 2 or 5, and the capacitive elements in the SCB 904 are configured to provide the capacitance C DISCRETE in the resonator circuit 201 or 501, respectively.

Figure 11:
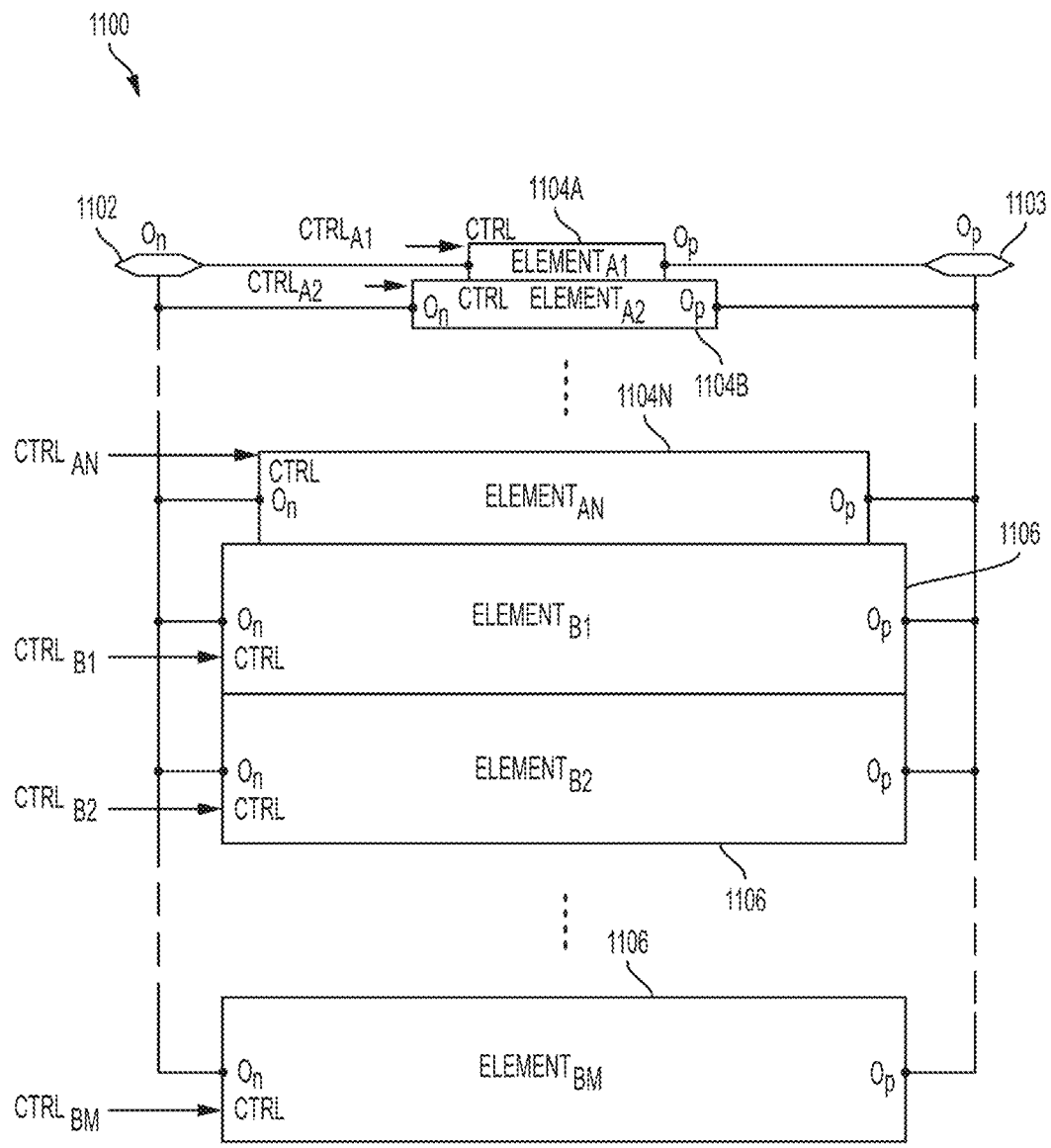
FIG. 11 is a diagram showing an example switched capacitor bank (SCB).

In some implementations, the SCB 904 can be implemented according to the example SCB 1100 shown in FIG. 11, or the SCB 904 may be implemented in another manner. The example SCB 904 includes two groups of capacitive elements that can each be selectively activated by the SCB 904 according to control signals received by the SCB 904. In the example shown in FIG. 9, the SCB 904 has a first group of capacitive elements that can each be individually activated according to the control signal CTRL_A, and the SCB 904 has a second group of capacitive elements that can each be individually activated according to the control signal CTRL_B. In some implementations, each of the capacitor bank elements in the first group has a distinct nominal reactance, and each of the capacitor bank elements in the second group has a substantially same nominal reactance. As an example, the SCB 904 can be configured as the example SCB 1100 shown in FIG. 11, where the capacitor bank elements in the first group (controlled by CTRL_A) are arranged in a significance order, each having a nominal reactance times $2^{n-1}$, wherein n represents the position in the significance order.

As shown in FIG. 9, a K-bit input signal 920 is received by the coarse tuning system 900. In some cases, the K-bit input signal 920 can be received from another component of a VCO, such as, for example, a phase locked loop (PLL) or from another source. In the example shown in FIG. 9, the K-bit input signal 920 includes an N-bit first portion 922, an L-bit second portion 924, and a 1-bit third portion 926. The K-bit input signal 920 can be configured in another manner. In some implementations, the K-bit input signal 920 includes an input value that represents a digital capacitance level for a digital-controlled portion of a resonator circuit. For instance, the K-bit input signal 920 may include a value for the variable D_tune shown in FIG. 14.

In the example shown in FIG. 9, the N-bit first portion 922 is input into the SCB 904 as the control signal CTRL_A for the first group of capacitor bank elements. In response to receiving the N-bit first portion 922, the SCB 904 activates (or de-activates) one or more of the first group of capacitor bank elements, for example, in the resonator circuit of a VCO. The L-bit second portion 924 is processed by the control logic 902 to produce an M-bit control signal 932, and the M-bit control signal 932 is input into the SCB 904 as the control signal CTRL_B for the second group of capacitor bank elements. In response to receiving the M-bit control signal 932, the SCB 904 activates (or de-activates) one or more of the second group of capacitor bank elements, for example, in the resonator circuit of a VCO.

In the example control logic 902 shown in FIG. 9, the L-bit second portion 924 is input into the BtT decoder 906 and the LUT 908. The BtT decoder 906 and the LUT 908 each receive the same L-bit second portion 924 and generate distinct output values that are routed to respective inputs of the multiplexer 910. A first M-bit input 929 of the multiplexer 910 receives a first set of values based on the output generated by the BtT decoder 906, and a second M-bit input 931 of the multiplexer 910 receives a second set of values based on the output generated by the LUT 908. The multiplexer 910 selects between the two distinct sets of values and routes the selected set of values (either the first set of values or the second set of values) to an M-bit output 933 of the multiplexer 910, and the selected set of values becomes the M-bit control signal 932 (M) that is communicated to the SCB 904.

The example BtT decoder 906 decodes input values from binary code format to thermometer code format. For example, the BtT decoder 906 can include digital electronic circuitry configured to perform binary to thermal decoding operations. In the example shown in FIG. 9, the L-bit second portion 924 is input into the BtT decoder 906, and the BtT decoder 906 converts the binary L-bit second portion 924 to a thermometer coded M-bit output (containing bit values $O_1$ through $O_M$). The thermometer coded M-bit output value is communicated to the first M-bit input 929 of the multiplexer 910 through connections 928.

In the example shown, the connections 928 are reversing connections that reverse the order of the bit values output by the BtT decoder 906. For instance, the least significant bit ($O_1$) from the thermometer coded M-bit output is routed to the most significant bit ($A_M$) of the first M-bit input 929, and the most significant bit ($O_M$) of the thermometer coded M-bit output is routed to the least significant bit ($A_1$) of the first M-bit input 929.

Thus, the first M-bit input 929 of the multiplexer 910 receives the first set of values (containing bit values $A_1$ through $A_M$) from the BtT decoder 906. The first set of values received at the first M-bit input 929 of the multiplexer 910 represents a first combination of the capacitor bank elements in the second group (i.e., the group of capacitor bank elements that are controlled by CTRL_B). For example, each bit value ($A_1$ through $A_M$) in the first set of values can indicate whether to activate a respective one of the capacitor bank elements in the second group.

The example LUT 908 is a programmable lookup table that stores computer-readable mapping data, and uses the computer-readable mapping data to map input values (e.g., each L-bit second portion 924) to respective output values. The LUT 908 can be programmed, for example, by program code 936 (P) input into a data input port (Din) of the LUT 908 and a table write control bit 934 (T_Write) that enables the reading or writing of the program code 936 (P) to the LUT 908. In the example shown in FIG. 9, the L-bit second portion 924 is input into the LUT 908, and the LUT 908 maps the binary L-bit second portion 924 to a stored M-bit output (containing bit values $O_1$ through $O_M$). The stored M-bit output is communicated to the second M-bit input 931 of the multiplexer 910 through connections 930.

In the example shown, the connections 930 are non-reversing connections that preserve the order of the bit values output by the LUT 908. For instance, the least significant bit ($O_1$) from the LUT output is routed to the least significant bit ($B_1$) of the second M-bit input 931, and the most significant bit ($O_M$) from the LUT output is routed to the most significant bit ($B_M$) at the second M-bit input 931.

Thus, the second M-bit input 931 of the multiplexer 910 receives a second set of values (containing bit values $B_1$ through $B_M$) from the LUT 908. The second set of values received at the second M-bit input 931 of the multiplexer 910 represents a second, different combination of the capacitor bank elements in the second group (controlled by CTRL_B). For example, each bit value ($B_1$ through $B_M$) in the second set of values can indicate whether to activate a respective one of the capacitor bank elements in the second group.

In the example shown in FIG. 9, the 1-bit third portion 926 is a control input that controls whether the first set of input values (received at the first M-bit input 929) or the second set of input values (received at the second M-bit input 931) is input into the SCB 904 as the control signal CTRL_B for the second group of capacitor bank elements. The 1-bit third portion 926 is communicated to the select input 927 (Sel) of the multiplexer 910. In response to the control input, the multiplexer 910 generates an M-bit control signal 932 that selects either a first combination of capacitor bank elements (according to the first input value received at the M-bit input 929) or a second combination of capacitor bank elements (according to the second input value received at the M-bit input 931). The M-bit control signal 932 is input to the SCB 904 as a second capacitor bank element section control signal CTRL_B to activate the selected combination of capacitor bank elements.

Figure 10:
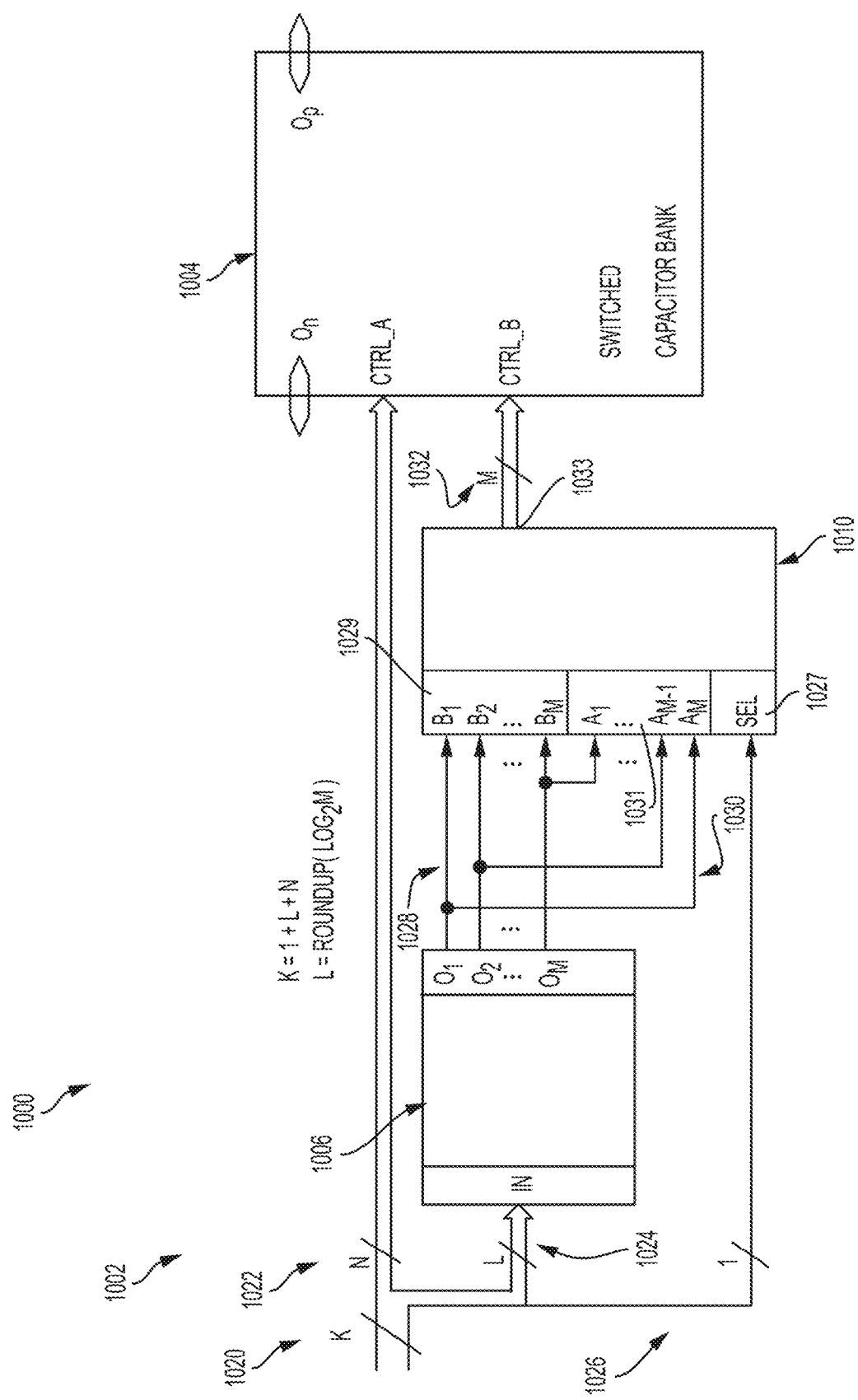
FIG. 10 is a diagram of another example coarse tuning system.

FIG. 10 is a diagram of an example coarse tuning system 1000. The example coarse tuning system 1000 shown in FIG. 10 includes a switched capacitor bank (SCB) 1004 and control logic 1002 that controls the SCB 1004. The control logic 1002 includes a binary-to-thermometer (BtT) decoder 1006 and a multiplexer 1010. A coarse tuning system may include additional or different features, and the components may be configured as shown in FIG. 10 or in another manner.

In some implementations, the coarse tuning system 1000 can be included in a voltage controlled oscillator (VCO), for example, to tune a resonator circuit in the VCO. For instance, all or part of the coarse tuning system 1000 may be included in the example VCO 200 shown in FIG. 2, the example VCO 500 shown in FIG. 5 or another type of VCO. In some cases, the coarse tuning system 1000 is operable to tune the resonator circuit by controlling a capacitive portion the resonator circuit (e.g., by modifying a digital-controlled capacitive element, or in another manner).

In some implementations, the coarse tuning system 1000 includes capacitive elements that are connected as the digital-controlled capacitive element of a resonator circuit in a VCO. For instance, the capacitive elements in the SCB 1004 can be connected in a resonator circuit as the digital-controlled capacitive element 206 in the example VCO 200 shown in FIG. 2 or as the digital-controlled capacitive element 506 in the example VCO 500 shown in FIG. 5. In some cases, the K-bit input signal 1020 shown in FIG. 10 corresponds to the multi-bit control code shown in FIG. 2 or 5, and the capacitive elements in the SCB 1004 are configured to provide the capacitance $C_{DISCRETE}$ in the resonator circuit 201 or 501, respectively.

In some implementations, the SCB 1004 can be implemented according to the example SCB 1100 shown in FIG. 11, or the SCB 1004 may be implemented in another manner. The example SCB 1004 includes two groups of capacitive elements that can each be selectively activated by the SCB 1004 according to control signals received by the SCB 1004. In the example shown in FIG. 10, the SCB 1004 has a first group of capacitive elements that can each be individually activated according to the control signal CTRL_A, and the SCB 1004 has a second group of capacitive elements that can each be individually activated according to the control signal CTRL_B. In some implementations, each of the capacitor bank elements in the first group has a distinct nominal reactance, and each of the capacitor bank elements in the second group has a substantially same nominal reactance.

As shown in FIG. 10, a K-bit input signal 1020 is received by the coarse tuning system 1000. In some cases, the K-bit input signal 1020 can be received from another component of a VCO, such as, for example, a phase locked loop (PLL) or from another source. In the example shown in FIG. 10, the K-bit input signal 1020 includes an N-bit first portion 1022, an L-bit second portion 1024, and a 1-bit third portion 1026. The K-bit input signal 1020 can be configured in another manner. In some implementations, the K-bit input signal 1020 includes an input value that represents a digital capacitance level for a digital-controlled portion of a resonator circuit. For instance, the K-bit input signal 1020 may include a value for the variable D_tune shown in FIG. 14.

In the example shown in FIG. 10, the N-bit first portion 1022 is input into the SCB 1004 as the control signal CTRL_A for the first group of capacitor bank elements. In response to receiving the N-bit first portion 1022, the SCB 1004 activates (or de-activates) one or more of the first group of capacitor bank elements, for example, in the resonator circuit of a VCO. The L-bit second portion 1024 is processed by the control logic 1002 to produce an M-bit control signal 1032, and the M-bit control signal 1032 is input into the SCB 1004 as the control signal CTRL_B for the second group of capacitor bank elements. In response to receiving the M-bit control signal 1032, the SCB 1004 activates (or de-activates) one or more of the second group of capacitor bank elements, for example, in the resonator circuit of a VCO.

In the example control logic 1002 shown in FIG. 10, the L-bit second portion 1024 is input into the BtT decoder 1006. A first M-bit input 1029 of the multiplexer 1010 receives a first set of values based on the output generated by the BtT decoder 1006, and a second M-bit input 1031 of the multiplexer 1010 receives a second set of values based on the output generated by the BtT decoder 1006. In the example shown in FIG. 10, the first set of input values is the reverse of the second set of input values. The multiplexer 1010 selects between the two distinct sets of values and routes the selected set of values (either the first set of values or the second set of values) to an M-bit output 1033 of the multiplexer 1010, and the resulting M-bit control signal 1032 (M) is communicated to the SCB 1004.

The example BtT decoder 1006 shown in FIG. 10 is similar to the BtT decoder 906 shown in FIG. 9. In the example shown in FIG. 10, the BtT decoder 1006 converts the binary L-bit second portion 1024 to a thermometer coded M-bit output (containing bit values $O_1$ through $O_M$). The thermometer coded M-bit output is communicated to the first M-bit input 1029 of the multiplexer 1010 through a first set of connections 1028, and the thermometer coded M-bit output is communicated to the second M-bit input 1031 of the multiplexer 1010 through a second, different set of connections 1030.

In the example shown, the first set of connections 1028 are direct (non-reversing) connections that preserve the order of the bit values output by the BtT decoder 1006, and the second set of connections 1030 are reversing connections that reverse the order of the bit values output by the BtT decoder 1006. For instance, the least significant bit ($O_1$) from the thermometer coded M-bit output is routed to the most significant bit ($A_M$) of the second M-bit input 1031, and the most significant bit ($O_M$) from the thermometer coded M-bit output is routed to the least significant bit ($A_1$) of the second M-bit input 1031. By contrast, the least significant bit ($O_1$) from the thermometer coded M-bit output is routed to the least significant bit ($B_1$) of the first M-bit input 1029, and the most significant bit ($O_M$) from the thermometer coded M-bit output is routed to the most significant bit ($B_M$) of the first M-bit input 1029.

The first set of values received at the first M-bit input 1029 of the multiplexer 1010 represents a first combination of the capacitor bank elements in the second group (controlled by CTRL_B). For example, each bit value ($A_1$ through $A_M$) in the first set of values can indicate whether to activate a respective one of the capacitor bank elements in the second group. The second set of values received at the second M-bit input 1031 of the multiplexer 1010 represents a second, different combination of the capacitor bank elements in the second group (controlled by CTRL_B). For example, each bit value ($B_1$ through $B_M$) in the second set of values can indicate whether to activate a respective one of the capacitor bank elements in the second group.

In the example shown in FIG. 10, the 1-bit third portion 1026 is a control input that controls whether the first set of input values (received at the first M-bit input 1029) or the second set of input values (received at the second M-bit input 1031) is input into the SCB 1004 as the control signal CTRL_B for the second group of capacitor bank elements. The 1-bit third portion 1026 is communicated to the select input 1027 (Sel) of the multiplexer 1010. In response to the 1-bit third portion 1026, the multiplexer 1010 generates an M-bit control signal 1032 that selects either the first combination of capacitor bank elements (according to the first input values received at the first M-bit input 1029) or the second combination of capacitor bank elements (according to the second input values received at the second M-bit input 1031). The M-bit control signal 1032 is input to the SCB 1004 as a second capacitor bank element section control signal CTRL_B to activate the selected combination of capacitor bank elements.

FIG. 11 is a diagram showing an example switched capacitor bank (SCB) 1100. The example SCB 1100 includes a first capacitor bank element section including a number (N) of first capacitor bank elements 1104A-N that each have a distinct nominal reactance value. The first capacitor bank elements include Element$_{A1}$ 1104A, Element$_{A2}$ 1104B through Element$_{AM}$ 1104N. The example SCB 1100 also includes a second capacitor bank element section including a number (M) of second capacitor bank elements 1106 that all have a common nominal reactance value. The second capacitor bank elements 1106 include Element$_{B1}$, Element$_{B2}$ through Element$_{BM}$. The first capacitor bank elements 1104A-N and the second capacitor bank elements 1106 are connected in parallel between a first node 1102 (labeled "$O_n$") and a second node 1103 (labeled "$O_p$"). A switched capacitor bank may include additional or different features, and the components can be arranged as shown or in another manner.

In some cases, the example SCB 1100 can be used in a coarse tuning system, for instance, to provide digital-controlled capacitive elements in a voltage controlled oscillator circuit. For example, the example SCB 1100 shown in FIG. 11 may be used as the SCB 904 shown in FIG. 9 or the SCB 1004 shown in FIG. 10 in some cases. In such cases, the nodes labeled "$O_n$" and "$O_p$" in FIG. 11 may correspond to the nodes labeled "$O_n$" and "$O_p$" in either of the switched capacitor banks shown in FIGS. 9 and 10; and the control signals "CTRL_A" and "CTRL_B" shown in FIGS. 9 and 10 may include the bit values (e.g., Ctrl$_{A1}$, Ctrl$_{A2}$, Ctrl$_{AN}$, Ctrl$_{B1}$, Ctrl$_{B2}$, Ctrl$_{BM}$, etc.) shown in FIG. 11. The SCB 1100 may be used in another type of system or environment.

In the example shown in FIG. 11, each of the first capacitor bank elements 1104A-N is controlled by a respective bit value (labeled $Ctrl_{A1}$, $Ctrl_{A2}$, and $Ctrl_{AN}$) of a control signal CTRL_A for the first capacitor bank element section, and each of the second capacitor bank elements 1106 is controlled by a respective bit value (labeled $Ctrl_{B1}$, $Ctrl_{B2}$, and $Ctrl_{BM}$) of a control signal CTRL_B for the second capacitor bank element section. The respective bits of the control signals (CTRL_A and CTRL_B) control whether the respective capacitor bank elements are coupled to the first node 1102 and the second node 1103 of the SCB 1103. In some cases, the capacitor bank elements in the example SCB 1100 can be implemented according to the example shown in FIG. 12, or the capacitor bank elements in the example SCB 1100 can be implemented in another manner.

In the example shown in FIG. 11, the first capacitor bank elements 1104A-N define a series of distinct nominal reactance values. The series of reactance values can be an exponentially weighted series or another type of series. For example, the reactance of the first capacitor bank elements 1104A-N can define a series $X_n=2^{n-1}X_0$, where $X_0$ is a nominal base reactance value, n is a position of a given first capacitor bank element 1104A-N within an ordered array that defines the series, and $X_n$ is the reactance of the given first capacitor bank element. In this example, if the first capacitor bank element section includes seven elements (N=7), the reactance value of the capacitor bank element 1104A is $X_1=X_0$; the reactance value of the second capacitor bank element 1104B is $X_2=2X_0$; and the reactance value of the capacitor bank element 1104N is $X_7=64X_0$. In some cases, the nominal reactance values of the first capacitor bank elements 1104A-N are arranged in another manner.

In the example shown in FIG. 11, the second capacitor bank elements 1106 all have the same nominal reactance value, which is twice the nominal reactance of the capacitor bank element 1104N. In the example noted above, the reactance value of each of the second capacitor bank elements 1106 is $X_m=128X_0$. In some cases, the nominal reactance values of the second capacitor bank elements 1106 are arranged in another manner.

When the SCB 1100 operates in a coarse tuning system, such as, for example, the coarse tuning systems 900, 1000 shown in FIGS. 9 and 10, each the first capacitor bank elements 1104A-N and second capacitor bank elements 1106 can be selectively activated in a resonator circuit (e.g., the resonator circuits of the example VCOs 200 and 500 shown in FIGS. 2 and 5, respectively). For instance, the capacitor bank element 1104N can be connected into a resonator circuit of a VCO according to the bit value $CTRL_{AN}$. When a capacitor bank element is activated in a resonator circuit, the added reactance of the capacitor bank element modifies the resonance frequency of the resonator circuit. In some cases, the reactance $X_k$ (as seen by the resonator circuit) of a given element k of the first capacitor bank elements 1104A-N or the second capacitor bank elements 1106 can be expressed as $$X_k = \frac{-1}{\omega C_k} + \omega L_k^{(parasit)},$$

where $C_k$ represents the capacitance of the given element k, $\omega$ represents the frequency of the resonator circuit and $L_k^{(parasit)}$ represents the connectivity parasitic inductance of the given element k. In some instances, the length from $O_n$ (or $O_p$) to the kth element produces (the parasitic inductance, and the value of $L_k^{(parasit)}$ is different for each element k because it is located at a different location relative to $O_n$ (or $O_p$).

When the SCB 1100 is used in the context of a VCO (e.g., the example VCOs 200 and 500 shown in FIGS. 2 and 5, respectively), the capacitor bank elements of the SCB 1100 can provide the digital-controlled capacitive element in the VCO (e.g., the digital-controlled capacitive elements 206 and 506 shown in FIGS. 2 and 5, respectively). In such cases, the base nominal reactance value $X_0$ for the capacitor bank elements of the SCB 1100 can be selected based on an effective frequency tuning range obtained by tuning the analog-controlled capacitive element in the VCO (e.g., the analog-controlled capacitive elements 204 and 504 shown in FIGS. 2 and 5, respectively). In some cases, the effective frequency tuning range obtained by tuning the analog-controlled capacitive element takes into consideration a linear frequency response region of a signal output by the VCO and a temperature response of the VCO. The effective frequency tuning range can extend, for instance, from the highest low end of the linear frequency range to the lowest high end of the linear range when considering the linear range over a given temperature range, e.g. −40° C. to +80° C. The base nominal reactance value $X_0$ may then be chosen to effect a discrete frequency increase or decrease in the output signal of the VCO from tuning the digital-controlled capacitive element corresponding to the effective frequency tuning range obtained by tuning the analog-controlled capacitive element. In some cases, the nominal reactance value $X_0$ is chosen to allow for some overlap at the endpoints of the effective frequency tuning range to prevent gaps in a frequency response, which may otherwise occur due to fabrication process variation, digital-to-analog conversion error in tuning the analog-controlled capacitive element, etc.

Figure 14:
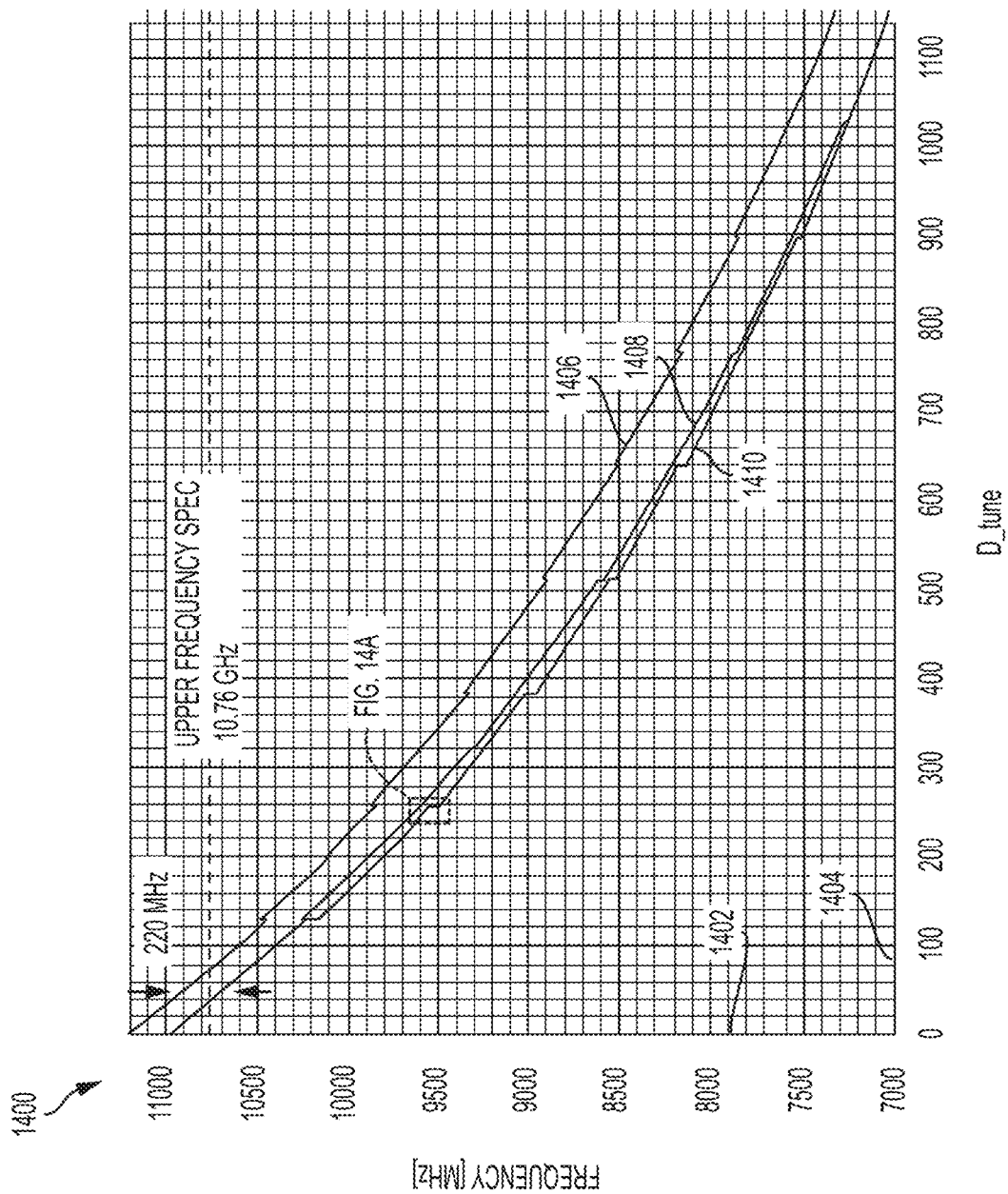
FIG. 14 is a plot of an example VCO output frequency.

In some implementations, when the SCB 1100 is used in the context of a VCO, the difference between frequencies of output signals of the VCO at adjacent discrete tuning points (e.g., the digital capacitance levels represented by D_tune in FIG. 14) due to tuning the digital-controlled capacitive element of the VCO is typically equal to or less than the effective frequency tuning range obtained by tuning the analog-controlled capacitive element. This difference between frequencies generated by tuning the digital-controlled capacitive element in the VCO is influenced by the nominal reactance value $X_0$, and is generally proportional to the reactance of the first capacitor bank element 1104A having the lowest reactance value.

Figure 12:
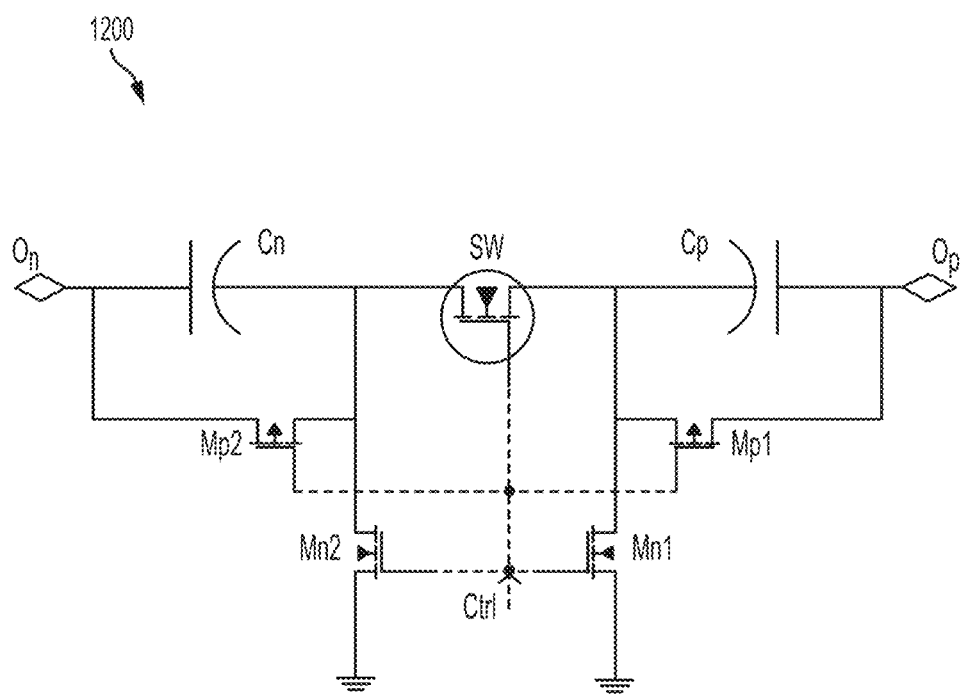
FIG. 12 is a circuit diagram of an example capacitor bank element.

FIG. 12 is a circuit diagram of an example capacitor bank element 1200. In some cases, the first capacitor bank elements 1104A-N and the second capacitor bank elements 1106 shown in FIG. 11 can have the structure of the example capacitor bank element 1200 of FIG. 12. In such cases, the nodes labeled "$O_n$" and "$O_p$" in FIG. 12 may correspond to the nodes labeled "$O_n$" and "$O_p$" in the switched capacitor bank shown in FIG. 11. The example capacitor bank element 1200 shown in FIG. 12 includes a switch SW, a first p-type transistor Mp1, a second p-type transistor Mp2, a first n-type transistor Mn1, a second n-type transistor Mn2, a first capacitor Cn, and a second capacitor Cp. In the example shown, the switch SW is an n-type transistor (e.g., an n-type MOSFET). The first p-type transistor Mp1 and the second p-type transistor Mp2 can be p-type MOSFETs, and the first n-type transistor Mn1 and the second n-type transistor Mn2 can be n-type MOSFETs.

In the example shown in FIG. 12, the respective gates of the switch SW, the first p-type transistor Mp1, the second p-type transistor Mp2, the first n-type transistor Mn1, and the second n-type transistor Mn2 are coupled to a control node Ctrl, where bit value (e.g., $Ctrl_{A1}$ ... $Ctrl_{AN}$, $Ctrl_{B1}$ ... $Ctrl_{BM}$, etc.) can be input. A first node of the first capacitor Cn and a first source/drain of the second p-type transistor Mp2 are connected to the first input node (labeled "$O_n$" in FIG. 12). A second node (opposite the first node) of the first capacitor Cn, a second source/drain (opposite the first source/drain) of the second p-type transistor Mp2, a first source/drain of the switch SW, and a first source/drain of the second n-type transistor Mn2 are connected together. A second source/drain (opposite the first source/drain) of the second n-type transistor Mn2 is coupled to ground (or VSS). A first node of the second capacitor Cp and a first source/drain of the first p-type transistor Mp1 can be connected to the second input node (labeled "$O_p$" in FIG. 12). A second node (opposite the first node) of the second capacitor Cp, a second source/drain (opposite the first source/drain) of the first p-type transistor Mp1, a second source/drain (opposite the first source/drain) of the switch SW, and a first source/drain of the first n-type transistor Mn1 are connected together. A second source/drain (opposite the first source/drain) of the first n-type transistor Mn1 is coupled to ground (or VSS).

In some implementations, the switch SW is an n-type MOSFET having a minimum design rule channel length and a width chosen based on $C_{on}/C_{off} \geq 4$ and $Q \geq 14$, where $C_{on}$ represents the capacitance of the switch SW in the on state, $C_{off}$ represents the capacitance of the switch SW in the off state, and Q is the quality factor of $C_{on}$. From a noise perspective, a higher Q may be beneficial, but a higher Q may require a larger switch SW, which can increase parasitic drain to source capacitance thereby increasing $C_{off}$ and decrease $C_{on}/C_{off}$. In some implementations, the channel lengths and widths of the first and second n-type transistors Mn1 and Mn2 are a minimum design rule amount. Further, in some implementations, the widths of the first and second p-type transistors Mp1 and Mp2 are a minimum design rule amount, and the channel lengths of the first and second p-type transistors Mp1 and Mp2 are increased such that the resistance of the first and second p-type transistors Mp1 and Mp2 is much greater than $1/(\omega C_n)$. In some implementations, different values and sizes of the switch SW and transistors Mn1, Mn2, Mp1, and Mp2 may be used.

In operation, when the control signal Ctrl is such that the switch SW, the first n-type transistor Mn1, and the second n-type transistor are closed, and the first p-type transistor Mp1 and the second p-type transistor Mp2 are open, the first capacitor Cn is coupled between the first input node $O_n$ and ground (or VSS) in a closed loop configuration, and the second capacitor Cp is coupled between the second input node $O_p$ and ground (or VSS) in a closed loop configuration. When the control signal Ctrl is such that the switch SW, the first n-type transistor Mn1, and the second n-type transistor are open, and the first p-type transistor Mp1 and the second p-type transistor Mp2 are closed, the first capacitor Cn and the second capacitor Cp are in an open loop and effectively disconnected, and the first p-type transistor Mp1 and the second p-type transistor Mp2 can allow for leakage or shorting of the second capacitor Cp and the first capacitor Cn, respectively.

The following discussion considers examples where the SCB 1100 shown in FIG. 11 is used as the SCB 904 or the SCB 1004 in the example coarse tuning systems 900 and 1000 shown in FIGS. 9 and 10, respectively. In some aspects of operation, the N-bit first portion 922/1022 of the K-bit input signal 920/1020 is input into the SCB 904/1004 as the first capacitor bank element section control signal CTRL_A.

The least significant bit of the N-bit first portion 922/1022 can be the bit value ($CTRL_{A1}$) of the first capacitor bank element section control signal CTRL_A, the most significant bit of the N-bit first portion 922/1022 can be the most significant bit ($CTRL_{AN}$) of the first capacitor bank element section control signal CTRL_A, and the same correspondence can hold for intermediate bits of the N-bit first portion 922/1022 to respective intermediate bit values of the first capacitor bank element section control signal CTRL_A. Hence, the least significant bit of the N-bit first portion 922/1022 can control whether the one or more capacitors (e.g., first capacitor Cn and the second capacitor Cp shown in FIG. 12) in the least significant first capacitor bank element 1104A are coupled in a closed loop configuration in the resonator circuit of the VCO or are in an open loop configuration; the next significant bit of the N-bit first portion 922/1022 can control whether the one or more capacitors in the next significant first capacitor bank element 1104B are coupled in a closed loop configuration in the resonator circuit of the VCO or are in an open loop configuration; and so forth.

In some aspects of operation, the M-bit control signal 932/1032 output from the multiplexer 910/1010 is input into the SCB 904/1004 as the second capacitor bank element section control signal CTRL_B. The least significant bit of the M-bit control signal 932/1032 can be the bit value ($CTRL_{B1}$) of the second capacitor bank element section control signal CTRL_B, the most significant bit of the M-bit control signal 932/1032 can be the bit value ($CTRL_{BN}$) of the second capacitor bank element section control signal CTRL_B, and the same correspondence can hold for intermediate bits of the M-bit control signal 932/1032 to respective intermediate bit values of the second capacitor bank element section control signal CTRL_B. Hence, a least significant bit of the M-bit control signal 932/1032 can control whether the one or more capacitors (e.g., the first capacitor Cn and the second capacitor Cp shown in FIG. 12) in $Element_{B1}$ are coupled in a closed loop configuration in the resonator circuit of the VCO or are in an open loop configuration, the next significant bit of the M-bit control signal 932/1032 can control whether the one or more capacitors in $Element_{B2}$ are coupled in a closed loop configuration in the resonator circuit of the VCO or are in an open loop configuration; and so forth.

In some aspects of operation, the multiplexer 910/1010 generates the M-bit control signal 932/1032 by selecting between the first M-bit input 929/1029 or the second M-bit input 931/1031. Thus, the first set of values received by first M-bit input 929/1029 or second set of values received by the second M-bit input 931/1031 controls which of the second capacitor bank elements 1106 have closed loop connected capacitors. The ability to select between two distinct combinations of capacitor bank elements can allow for greater flexibility, for example, when accommodating linearity of the frequency output of the VCO.

In the example coarse tuning systems 900 and 1000 shown in FIGS. 9 and 10, one set of input values is a reverse order thermometer code of the binary L-bit second portion 924/1024 of the K-bit input signal 920/1020; this set of input values is provided by operation of the BtT decoder 906/1006 and the connections 928/1030. If the multiplexer 910/1010 selects this set of values, the second capacitor bank elements 1106 will be activated according to their physical order in the SCB 1100. For example, when a single one of the second capacitor bank elements 1106 is selected, the capacitor bank element in the last or "bottom" position ($Element_{BM}$) will be activated (or turned "on"); when two of the second capacitor bank elements 1106 are selected, the capacitor bank elements in the last and next-to-last positions (Element$_{BM}$, Element$_{B(M-1)}$) will be activated; and so forth, such that the capacitor bank element in the first or "top" position (Element$_{B1}$) will be activated only when all of the second capacitor bank elements 1106 are activated. This selection process of the second capacitor bank elements 1106 can be referred to as a "bottom-to-top" ("B2T") selection.

In the example coarse tuning system 900 of FIG. 9, the set of input values received by the second M-bit input 931 of the multiplexer 910 can be any code that the LUT 908 is programmed to output based on the L-bit second portion 924 of the K-bit input signal 920. Hence, the programming of the LUT 908 allows for any arbitrary combination of the second capacitor bank elements 1106 to be selected. For example, when a single one of the second capacitor bank elements 1106 is selected, the capacitor bank element in any position (Elementz$_{BM}$) could potentially be activated (or turned "on"), based on the mapping data stored in the LUT 908; when two of the second capacitor bank elements 1106 are selected, any two of the capacitor bank elements could potentially be activated (or turned "on"), based on the mapping data stored in the LUT 908; and so forth.

In the example coarse tuning system 1000 of FIG. 10, the set of input values received by the first M-bit input 1029 is a non-reversed order thermometer code of the binary L-bit second portion 1024 of the K-bit input signal 1020; this set of input values is generated by operation of the BtT decoder 1006 and the connections 1028. If the multiplexer 1010 selects this set of values, the second capacitor bank elements 1106 will be activated based on their physical order in the SCB 1100. Here, the second capacitor bank elements 1106 are selected in an order that is different from the order that they are selected by the set of input values received by the second M-bit input 1031. For example, when a single one of the second capacitor bank elements 1106 is selected, the capacitor bank element in the first or "top" position (Element$_{B1}$) will be activated (or turned "on"); when two of the second capacitor bank elements 1106 are selected, the capacitor bank elements in the first and second positions (Element$_{B1}$, Element$_{B2}$) will be activated; and so forth, such that the capacitor bank element in the last or "bottom" position (Element$_{BM}$) will be activated only when all of the second capacitor bank elements 1106 are activated. This selection process of the second capacitor bank elements 1106 can be referred to as a "top-to-bottom" ("T2B") selection, which is the opposite of the "bottom-to-top" selection order outlined above.

Figure 13:
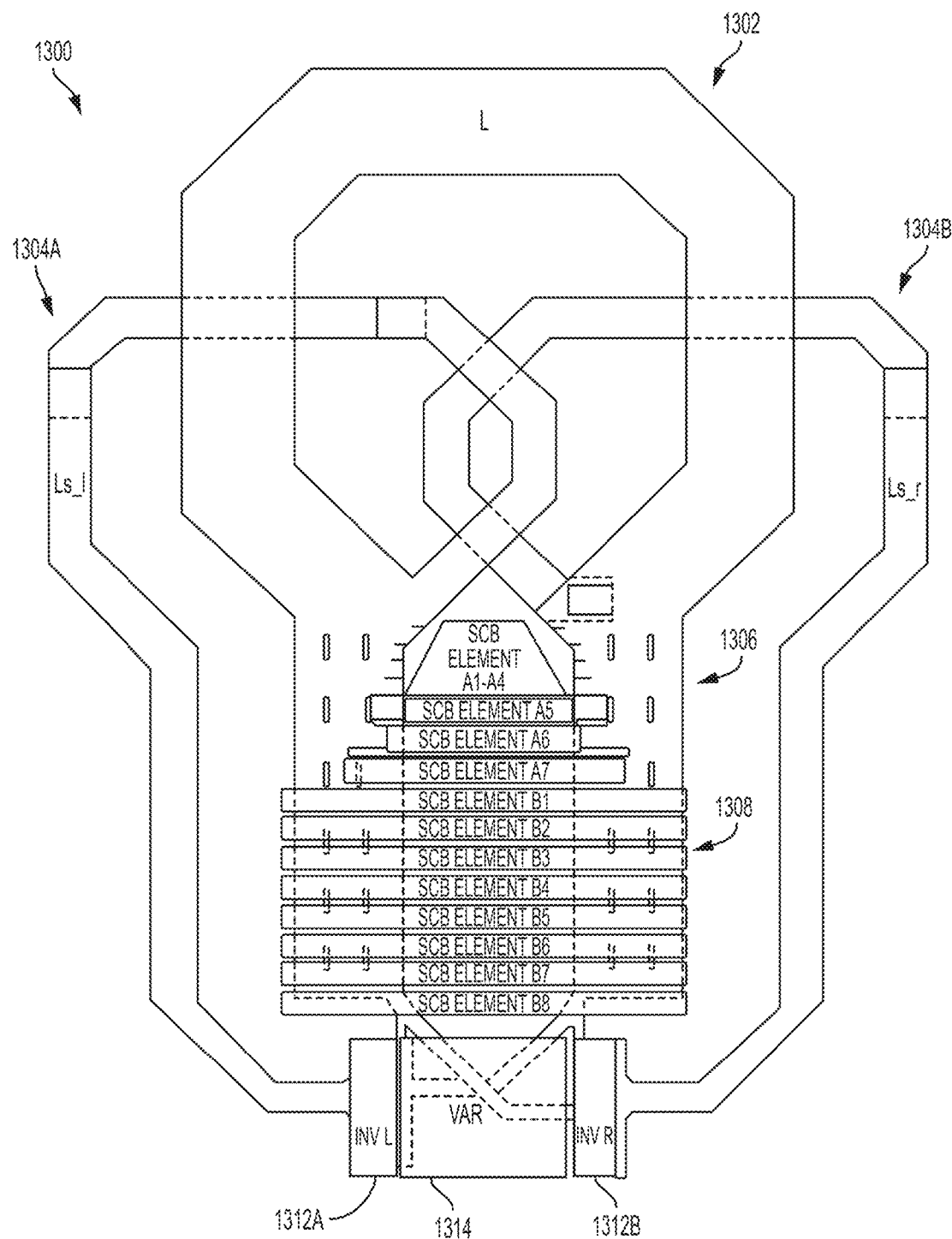
FIG. 13 is an integrated circuit layout of an example VCO.

FIG. 13 is an example integrated circuit layout 1300 of an example VCO. In some implementations, the example integrated circuit layout 1300 can be used to implement the example VCO 500 shown in FIG. 5 with the SCB 1100 shown in FIG. 11. In some cases, the example VCO 500 can be implemented according to another type of layout. Control logic (e.g., of the type shown in FIGS. 9 and 10, respectively) for controlling the SCB can be implemented outside of the area of the layout 1300 shown in FIG. 13.

The example layout 1300 includes portions in a semiconductor (e.g., silicon) substrate and portions in one or more metal layers embedded in a respective one or more dielectric layer on the semiconductor substrate. The layout 1300 includes a primary winding portion 1302 of a transformer (e.g., transformer 509), a first secondary winding portion 1304A of the transformer, and a second secondary winding portion 1304B of the transformer. The primary winding portion 1302 is in a first metal layer over the semiconductor substrate. The first secondary winding portion 1304A is partially in the first metal layer and partially in a second metal layer above or below the first metal layer at least where the first secondary winding portion 1304A overlaps with the primary winding portion 1302. Similarly, the second secondary winding portion 1304B is partially in the first metal layer and partially in a second metal layer at least where the second secondary winding portion 1304B overlaps with the primary winding portion 1302 and/or the first secondary winding portion 1304A.

The example layout 1300 includes an SCB having a first capacitor bank element section 1306 with first capacitor bank elements (SCB Element A1 through A7) and a second capacitor bank element section 1308 with second capacitor bank elements (SCB Element B1 through B8). The first capacitor bank elements in FIG. 13 can be similar to the first capacitor bank elements 1104A, 1104B through 1104N shown in FIG. 11, and the second capacitor bank elements shown in FIG. 13 can be similar to the second capacitor bank elements 1106 shown in FIG. 11. Each of the capacitor bank elements shown in FIG. 13 can be implemented in the semiconductor substrate and in one or more metal layers. In the example shown, the first portion (e.g., first node) of the first metal layer between the primary winding portion 1302 and the first secondary winding portion 1304A is coupled to respective input nodes of the capacitor bank elements, and a second portion (e.g., second node) of the first metal layer between the primary winding portion 1302 and the second secondary winding portion 1304B is coupled to respective other input nodes of the capacitor bank elements.

The example layout 1300 also includes a first inverter 1312A and a second inverter 1312B. Each of the first inverter 1312A and the second inverter 1312B can be implemented in the semiconductor substrate and in one or more metal layers. A first input of the first inverter 1312A is coupled to the first node of the first metal layer, and a second input of the first inverter 1312A is coupled to a third portion (e.g., a third node) of the first metal layer coupled to the first secondary winding portion 1304A opposite the primary winding portion 1302. An output of the first inverter 1312A is coupled to the second node of the first metal layer. A first input of the second inverter 1312B is coupled to the second node of the first metal layer, and a second input of the second inverter 1312B is coupled to a fourth portion (e.g., a fourth node) of the first metal layer coupled to the second secondary winding portion 1304B opposite the primary winding portion 1302. An output of the second inverter 1312B is coupled to the first node of the first metal layer.

The layout 1300 includes an analog capacitance tuning area 1314, which includes varactors (e.g., for analog-controlled capacitive element 504). The varactors can be implemented in the semiconductor substrate and in one or more metal layers. The varactors are coupled between the outputs of the first inverter 1312A and the second inverter 1312B, e.g., between the first node and the second node of the first metal layer.

FIG. 14 is a plot 1400 of an example VCO output frequency. The plot 1400 shows the output frequencies of an example VCO fabricated according to the layout 1300 shown in FIG. 13, when the switched capacitor bank is tuned over a range of digital capacitance levels by the example coarse tuning system 1000 shown in FIG. 10. The y-axis 1402 represents the output frequency of the VCO in units of megahertz (MHz). The x-axis 1404 represents digital capacitance levels (D_tune), which are the incremental steps available in tuning the digital-controlled capacitive element. Each value of D_tune corresponds to a distinct combination of capacitor bank elements selected by the control logic (e.g., according to the K-bit control signal). In the example shown in FIG. 13, there are seven capacitor bank elements in the A-group (N=7), and there are eight capacitor bank elements in the B-group (N=8). Like the example shown in FIG. 11, the nominal reactance values of the capacitor bank elements in the A-group define an ordered series in which each value is twice the value that precedes it, and the capacitor bank elements in the B-group all have the same nominal reactance value. In particular, in this example, the nominal reactance values of each of the B-group capacitor bank elements is $X_M = 2^N X_0 = 128 X_0$, and the available number of discrete steps is 1151 (e.g., $(1+M)2^N-1$).

FIG. 14 shows first output frequency data 1406, second output frequency data 1408, and third output frequency data 1410. The first output frequency data 1406 represent a simulation using a bottom-to-top selection process for the second group of capacitor bank elements (the B-group). The second output frequency data 1408 represents measurements of a physical implementation using a bottom-to-top selection process for the second group of capacitor bank elements. The third output frequency data 1410 represents measurements of a physical implementation using a top-to-bottom selection process for the second group of capacitor bank elements.

In the simulated first output frequency data 1406, inverted gaps (increases in frequency as D_tune is incremented) appear at the D_tune step between 127 to 128, between 255 to 256, etc. These are steps where a capacitor bank element in the B-group is activated. In the measured second and third output frequency data 1408 and 1410, non-inverted gaps (significant decreases in frequency as D_tune is incremented) appear at the D_tune step between 127 to 128, between 255 to 256, etc. These are steps where a capacitor bank element in the B-group is activated. The difference between the inverted gaps and the non-inverted gaps in the output frequency data 1406, 1408, and 1410 are likely the result of parasitic impedances not being accounted for in the simulation.

Figure 14A:
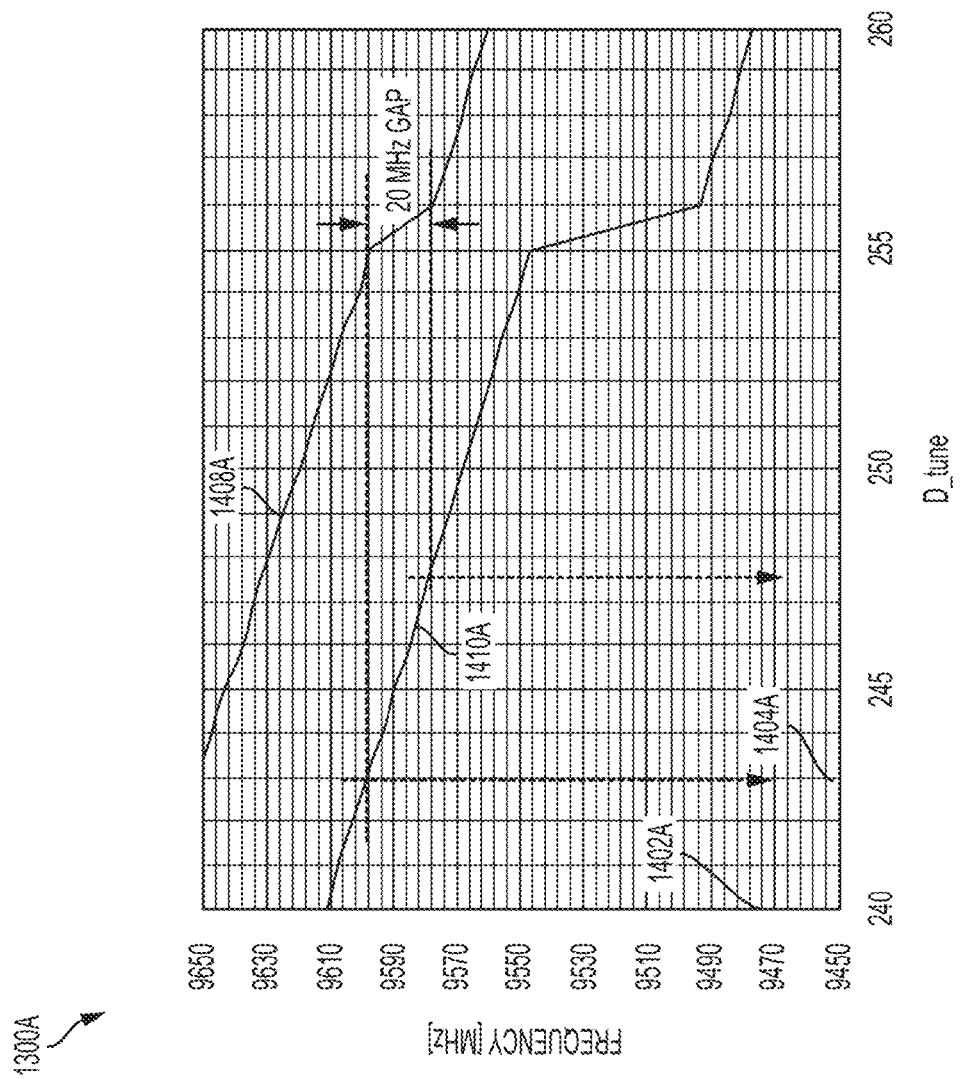
FIG. 14A is a closer view of a portion of the plot shown in FIG. 14.

FIG. 14A is a closer view 1400A of a portion of the plot 1400 shown in FIG. 14, as shown by the inset in FIG. 14. The second output frequency data portion 1408A and the third output frequency data portion 1410A are portions of the second output frequency data 1408 and the third output frequency data 1410, respectively, in the inset in the plot 1400. According to the nominal capacitance values of the capacitive elements, the second output frequency data portion 1408A and the third output frequency data portion 1410A would be equal at each D_tune value since the capacitor bank elements in the B-group all have the same nominal reactance. However, in practice, the capacitor bank elements in the second group usually do not have the same effective reactance, but the reactance can vary for each capacitor bank element (e.g., due to different interconnect lengths, fabrication process variation, etc). For example, the capacitor bank elements in the B-group may have different parasitic inductances due to the differing distances from the inductive portion of the resonator circuit. Hence, by choosing different combinations of capacitor bank elements in the B-group, the effective reactance can be different, which can lead to differing frequency outputs even when the same number of B-group elements are activated. As shown in the closer view 1400A of the plot 1400, in this example, the top-to-bottom selection process generally yields a lower frequency signal than the bottom-to-top selection process at the same D_tune step.

In the example shown in FIG. 14A, the second output frequency portion 1408A has a 20 MHz non-inverting gap between D_tune steps 255 and 256. When using the bottom-to-top selection process used in the second output frequency data portion 1408A, the VCO may not be able to generate a signal with a frequency within this 20 MHz non-inverting gap, and a PLL using the VCO may not be able to lock on such a frequency. However, the VCO may utilize the different frequency response of the bottom-to-top selection process to generate a signal within this 20 MHz non-inverting gap in the second output frequency data portion 1408A. As shown in the closer view 1400A, the third output frequency data portion 1410A achieves, at D_tune=243 to 248, a signal with the frequency within the 20 MHz non-inverting gap in the second output frequency data portion 1408A. Hence, when such a frequency is to be output by the VCO, the K-bit input signal 1020 can have a 1-bit third portion 1026 that controls the multiplexer 1010 to output the bit values to the SCB 1004 that achieves top-to-bottom selection using D_tune=243 to 248.

In the example coarse tuning systems 900 and 1000, two selection processes are used by the control logic 902 and 1002, respectively, and the two selection process can be used together, for instance, in a complimentary manner. For example, when the coarse tuning system 1000 of FIG. 10 is used, the bottom-to-top selection process may be used, except at frequencies where a non-inverting gap is created by the bottom-to-top selection process; and the top-to-bottom selection process can be used to achieve an output signal with a frequency within the non-inverting gaps of the bottom-to-top selection process. Or the use of the top-to-bottom and bottom-to-top selection process may be switched. As another example, when the coarse tuning system 900 of FIG. 9 is used, a VCO can select a bottom-to-top selection process or any selection process that is programmed into the LUT 908. Hence, the coarse tuning system 900 of FIG. 9 also offers flexibility in specifying the frequency output of the VCO. By allowing for selection between different selection processes to recover frequencies at non-inverting gaps, an integrated circuit VCO can operate with greater range or flexibility. In some cases, selecting between different selection processes allows a desired frequency resolution (or spacing) to be achieved without necessarily reducing the tuning range of the VCO.

In a general aspect, voltage controlled oscillators have been described. In some examples, the voltage controlled oscillators includes features or components that provide one or more advantages, as described above.

In a first example, a wireless sensor device includes a voltage controlled oscillator. The voltage controlled oscillator includes a first inverter, a second inverter, and a transformer. The first inverter includes a first inverter input node and a first inverter output node. The second inverter includes a second inverter input node and a second inverter output node. The transformer is connected between the first inverter and the second inverter and includes a primary winding portion and two secondary winding portions. The primary winding portion is connected between the first inverter output node and the second inverter output node and is inductively coupled to a first secondary winding portion and a second secondary winding portion. A first secondary winding portion is connected between the primary winding portion and the first inverter input node, and a second secondary winding portion is connected between the primary winding portion and the second inverter input node.

Implementations of the first example may, in some cases, include one or more of the following features. The first inverter includes a third inverter input node, the second inverter includes a fourth inverter input node, and the primary winding portion is connected between the third inverter input node and the fourth inverter input node. The first inverter includes an n-type MOSFET and a p-type MOSFET, and the second inverter includes an n-type MOSFET and a p-type MOSFET. The first inverter includes two n-type MOSFETs and two p-type MOSFETs, and the second inverter includes two n-type MOSFETs and two p-type MOSFETs.

Implementations of the first example may, in some cases, include one or more of the following features. The voltage controlled oscillator includes a capacitive portion connected between the first inverter and the second inverter. The capacitive portion includes a digital-controlled capacitor element. The capacitive portion includes an analog-controlled capacitor element.

In a second example, a voltage controlled oscillator circuit includes a transformer, a capacitive portion, a first inverter and a second inverter. The transformer has a primary winding portion connected between a first node and a second node; a first secondary winding portion connected between the first node and a third node; and a second secondary winding portion connected between the second node and a fourth node. The capacitive portion is connected between the first node and the second node. The first inverter has a first inverter input node connected to the third node and has a first inverter output node connected to the second node. The second inverter has a second inverter input node connected to the fourth node and has a second inverter output node connected to the first node.

Implementations of the second example may, in some cases, include one or more of the following features. The first inverter includes a first p-type transistor having a source coupled to a first power supply node; and a first n-type transistor having a source coupled to a second power supply node, a gate of the first p-type transistor and a gate of the first n-type transistor being connected together as the first inverter input node, a drain of the first p-type transistor and a drain of the first n-type transistor being connected together as the first inverter output node. The second inverter includes a second p-type transistor having a source coupled to the first power supply node; and a second n-type transistor having a source coupled to the second power supply node, a gate of the second p-type transistor and a gate of the second n-type transistor being connected together as the second inverter input node, a drain of the second p-type transistor and a drain of the second n-type transistor being connected together as the second inverter output node.

Implementations of the second example may, in some cases, include one or more of the following features. The first inverter includes a third inverter input node connected to the first node, and the second inverter has a fourth inverter input node connected to the second node. The first inverter includes a first p-type transistor having a source coupled to a first power supply node, a gate of the first p-type transistor being the first inverter input node; and a first n-type transistor having a source coupled to a second power supply node, a gate of the first n-type transistor being the third inverter input node, a drain of the first p-type transistor and a drain of the first n-type transistor being connected together as the first inverter output node. The second inverter includes a second p-type transistor having a source coupled to the first power supply node, a gate of the second p-type transistor being the second inverter input node; and a second n-type transistor having a source coupled to the second power supply node, a gate of the second n-type transistor being the fourth inverter input node, a drain of the second p-type transistor and a drain of the second n-type transistor being connected together as the second inverter output node. The first inverter includes: a first p-type transistor having a source coupled to a first power supply node; a first n-type transistor having a source coupled to a second power supply node, a gate of the first p-type transistor and a gate of the first n-type transistor being connected together as the first inverter input node; a second p-type transistor having a source coupled to the first power supply node; and a second n-type transistor having a source coupled to the second power supply node, a gate of the second p-type transistor and a gate of the second n-type transistor being connected together as the third inverter input node, respective drains of the first p-type transistor, the first n-type transistor, the second p-type transistor, and the second n-type transistor being connected together as the first inverter output node. The second inverter includes: a third p-type transistor having a source coupled to the first power supply node; a third n-type transistor having a source coupled to the second power supply node, a gate of the third p-type transistor and a gate of the third n-type transistor being connected together as the second input node; a fourth p-type transistor having a source coupled to the first power supply node; and a fourth n-type transistor having a source coupled to the second power supply node, a gate of the fourth p-type transistor and a gate of the fourth n-type transistor being connected together as the third inverter input node, respective drains of the third p-type transistor, the third n-type transistor, the fourth p-type transistor, and the fourth n-type transistor being connected together as the second inverter output node.

Implementations of the second example may, in some cases, include one or more of the following features. The transformer is an autotransformer. The capacitive element includes a first capacitor bank and a second capacitor bank; the first capacitor bank includes analog-tunable capacitors, and the second capacitor bank includes discretely-controlled capacitors.

In a third example, a first voltage from a first inverter is output to a first node of an inductive-capacitive (LC) tank. The LC tank includes a capacitive portion and a primary winding portion of a transformer, the capacitive portion being connected between the first node and a second node of the LC tank, the primary winding portion being connected between the first node and the second node. A second voltage from a third node is input to a first input node of the first inverter. A first secondary winding portion of the transformer is connected between the second node and the third node.

Implementations of the third example may, in some cases, include one or more of the following features. A third voltage from the second node is input to a second input node of the first inverter. The first voltage oscillates. Voltage is transformed in the transformer between the primary winding portion and the first secondary winding portion. A resonance frequency of the LC tank is controlled by controlling switches in the capacitive portion to selectively couple capacitors to the LC tank, by tuning analog-tunable capacitors in the capacitive portion, or both.

Implementations of the third example may, in some cases, include one or more of the following features. A third voltage from a second inverter is input to the second node. A fourth voltage from a fourth node is input to a second input node of the second inverter. A second secondary winding portion of the transformer is connected between the first node and the fourth node. Voltage is transformed in the transformer between the primary winding portion and the first secondary winding portion. Voltage is transformed in the transformer between the primary winding portion and the second secondary winding portion. The transformer is an autotransformer that includes the primary winding portion, the first secondary winding portion and the second secondary winding portion.

In a fourth example, a wireless sensor device includes a voltage controlled oscillator. The voltage controlled oscillator includes a resonator circuit, a multiplexer and control logic. The resonator circuit includes a switched capacitor bank operable to tune the resonator circuit. The switched capacitor bank includes capacitor bank elements. The multiplexer is communicatively coupled to the switched capacitor bank to select combinations of the capacitor bank elements based on input values representing digital capacitance levels. The multiplexer includes a first multi-bit input, a second multi-bit input and a multi-bit output. The first multi-bit input is configured to receive a first set of values representing a first combination of the capacitor bank elements. The second multi-bit input is configured to receive a second set of values representing a second, different combination of the capacitor bank elements. The multi-bit output is configured to communicate the first set of values or the second set of values to the switched capacitor bank to select either the first combination or the second combination. The control logic is configured to generate the first set of values and the second set of values for each of the digital capacitance levels.

Implementations of the fourth example may, in some cases, include one or more of the following features. The input value includes a first portion and a second portion. The control logic includes a decoder configured to receive the second portion of the input value and generate the first set of values by decoding the second portion of the input value; and a lookup table configured to receive the second portion of the input value and generate the second set of values according to computer-readable mapping data stored in the lookup table. The control logic includes a decoder configured to receive the second portion of the input value and generate the first set of values by decoding the second portion of the input value; and circuitry configured to receive the first set of values from the decoder and generate the second set of values by permuting the first set of values.

Implementations of the fourth example may, in some cases, include one or more of the following features. The input value includes a first portion and a second portion. The switched capacitor bank include first capacitor bank elements and second capacitor bank elements. The switched capacitor bank is operable to activate combinations of the first capacitor bank elements according to the first portion of each input value, and the switched capacitor bank is configured to activate the selected combinations of the second capacitor bank elements according to the first or second set of values received from the multiplexer. The multiplexer is communicatively coupled to the switched capacitor bank to select combinations of the second capacitor bank elements based on the second portion of the input values. The control logic is configured to generate the first set of values and the second set of values based on the second portion of the input values. Each of the second capacitor bank elements has a same nominal reactance, and each of the first capacitor bank elements has a distinct nominal reactance.

Implementations of the fourth example may, in some cases, include one or more of the following features. The multiplexer has a control input configured to receive a control value, and the multiplexer is operable to route either the first set of values or the second set of values to the multi-bit output based on the control value. The voltage controlled oscillator includes a gain portion connected to the resonator circuit.

In a fifth example, a voltage controlled oscillator circuit includes a resonator circuit and a multiplexer. The resonator circuit includes an inductive portion and a capacitive portion. The capacitive portion includes a switched capacitor bank that includes capacitor bank elements. The switched capacitor bank is configured to selectively activate combinations of the capacitor bank elements based on bit values from the multiplexer. The multiplexer includes a first multi-bit input, a second multi-bit input and a multi-bit output. The first multi-bit input is configured to receive a first set of bit values. The second multi-bit input is configured to receive a second, different set of bit values. The multi-bit output is communicatively coupled to the switched capacitor bank and configured to communicate either the first or second set of bit values to the switched capacitor bank.

Implementations of the fifth example may, in some cases, include one or more of the following features. The multiplexer has a control input configured to receive a control value, and the multiplexer is operable to route either the first set of bit values or the second set of bit values to the multi-bit output based on the control value.

Implementations of the fifth example may, in some cases, include one or more of the following features. The multi-bit output is a first multi-bit output, and the voltage controlled oscillator includes a binary to thermal decoder and a lookup table. The binary to thermal decoder is configured to generate the first set of bit values and has a second multi-bit output communicatively coupled to the first multi-bit input of the multiplexer. The lookup table is configured to generate the second set of bit values and has a third multi-bit output communicatively coupled to the second multi-bit input of the multiplexer.

Implementations of the fifth example may, in some cases, include one or more of the following features. The multi-bit output is a first multi-bit output, and the voltage controlled oscillator includes a binary to thermal decoder. The binary to thermal decoder is configured to generate the first set of bit values. The binary to thermal decoder has a second multi-bit output communicatively coupled to the first multi-bit input of the multiplexer, and a third multi-bit output communicatively coupled to the second multi-bit input of the multiplexer.

Implementations of the fifth example may, in some cases, include one or more of the following features. The capacitor bank elements all have the same reactance. The capacitor bank elements are first capacitor bank elements, and each of the first capacitor bank elements includes a first switch and a first capacitor. The first switch of each first capacitor bank element is operable to selectively couple the first capacitor of the first capacitor bank element with the resonator circuit in a closed-loop configuration. Each bit node of the multi-bit output is communicatively coupled to and configured to control a respective first switch of the first capacitor bank elements. The switched capacitor bank further includes second capacitor bank elements. Each of the second capacitor bank elements includes a second switch and a second capacitor. The second switch of each second capacitor bank element is operable to selectively couple the second capacitor of the second capacitor bank element with the resonator circuit in a closed-loop configuration. The second capacitor bank elements each have a distinct reactance. The second capacitor bank elements are arranged in a significance order. Each of the second capacitor bank elements has a nominal reactance times $2^{n-1}$, where n represents the position of the second capacitor bank element in the significance order.

In a sixth example, a first input signal and a second input signal are both input to a multiplexer. The first and second input signals are based on a digital capacitance level for a resonator circuit. The first input signal or the second input signal is selectively output from the multiplexer as a multiplexer output signal. Capacitor bank elements in the resonator circuit are selectively activate according to the multiplexer output signal.

Implementations of the sixth example may, in some cases, include one or more of the following features. A third input signal is input into a binary to thermometer decoder. A thermometer coded signal output from the binary to thermometer decoder is based on the third input signal. The thermometer coded signal is input as the first input signal into the multiplexer. A reverse bit order of the thermometer coded signal is input as the second input signal into the multiplexer.

Implementations of the sixth example may, in some cases, include one or more of the following features. A third input signal is input into a binary to thermometer decoder. The third input signal is input into a lookup table. A thermometer coded signal output from the binary to thermometer decoder is based on the third input signal. The thermometer coded signal is input as the first input signal into the multiplexer. A lookup table output signal output from the lookup table is based on the third input signal. The lookup table output signal is input as the second input signal into the multiplexer. Switches in the respective capacitor bank elements are controlled to couple capacitors to the resonator circuit in a closed loop configuration according to the multiplexer output signal. Each of the capacitor bank elements includes at least one switch controlled by a respective bit in the multiplexer output signal.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented separately or in any suitable subcombination.

A number of examples have been described. Nevertheless, it will be understood that various modifications can be made. Accordingly, other implementations are within the scope of the following claims.

What is claimed is:

1. A wireless sensor device comprising a voltage controlled oscillator, the voltage controlled oscillator comprising:
   a first inverter comprising a first inverter input node, a third inverter input node, and a first inverter output node;
   a second inverter comprising a second inverter input node, a fourth inverter input node, and a second inverter output node; and
   a transformer connected between the first inverter and the second inverter, the transformer comprising:
      a primary winding portion connected between the first inverter output node and the second inverter output node, connected between the third inverter input node and the fourth inverter input node, and inductively coupled to a first secondary winding portion and a second secondary winding portion;
      the first secondary winding portion connected between the primary winding portion and the first inverter input node; and
      the second secondary winding portion connected between the primary winding portion and the second inverter input node.

2. The wireless sensor device of claim 1, wherein the first inverter comprises an n-type MOSFET and a p-type MOSFET, and the second inverter comprises an n-type MOSFET and a p-type MOSFET.

3. The wireless sensor device of claim 1, wherein the first inverter comprises two n-type MOSFETs and two p-type MOSFETs, and the second inverter comprises two n-type MOSFETs and two p-type MOSFETs.

4. The wireless sensor device of claim 1, wherein the voltage controlled oscillator comprises a capacitive portion connected between the first inverter and the second inverter.

5. The wireless sensor device of claim 4, wherein the capacitive portion comprises a digital-controlled capacitor element.

6. The wireless sensor device of claim 5, wherein the capacitive portion comprises an analog-controlled capacitor element.

7. A voltage controlled oscillator circuit comprising:
   a transformer having a primary winding portion connected between a first node and a second node, a first secondary winding portion connected between the first node and a third node, and a second secondary winding portion connected between the second node and a fourth node;
   a capacitive portion connected between the first node and the second node;
   a first inverter having a first inverter input node connected to the third node, a third inverter input node connected to the first node, and a first inverter output node connected to the second node; and
   a second inverter having a second inverter input node connected to the fourth node, a fourth inverter input node connected to the second node, and a second inverter output node connected to the first node.

8. The voltage controlled oscillator of claim 7, wherein the first inverter comprises:
   a first p-type transistor having a source coupled to a first power supply node, a gate of the first p-type transistor being the first inverter input node; and
   a first n-type transistor having a source coupled to a second power supply node, a gate of the first n-type transistor being the third inverter input node, a drain of the first p-type transistor and a drain of the first n-type transistor being connected together as the first inverter output node; and
the second inverter comprises:
   a second p-type transistor having a source coupled to the first power supply node, a gate of the second p-type transistor being the second inverter input node; and
   a second n-type transistor having a source coupled to the second power supply node, a gate of the second n-type transistor being the fourth inverter input node, a drain of the second p-type transistor and a drain of the second n-type transistor being connected together as the second inverter output node.

9. The voltage controlled oscillator of claim 7, wherein the first inverter comprises:
   a first p-type transistor having a source coupled to a first power supply node;

a first n-type transistor having a source coupled to a second power supply node, a gate of the first p-type transistor and a gate of the first n-type transistor being connected together as the first inverter input node;

a second p-type transistor having a source coupled to the first power supply node; and a second n-type transistor having a source coupled to the second power supply node, a gate of the second p-type transistor and a gate of the second n-type transistor being connected together as the third inverter input node, respective drains of the first p-type transistor, the first n-type transistor, the second p-type transistor, and the second n-type transistor being connected together as the first inverter output node; and the second inverter comprises:

a third p-type transistor having a source coupled to the first power supply node;

a third n-type transistor having a source coupled to the second power supply node, a gate of the third p-type transistor and a gate of the third n-type transistor being connected together as the second input node;

a fourth p-type transistor having a source coupled to the first power supply node; and a fourth n-type transistor having a source coupled to the second power supply node, a gate of the fourth p-type transistor and a gate of the fourth n-type transistor being connected together as the third inverter input node, respective drains of the third p-type transistor, the third n-type transistor, the fourth p-type transistor, and the fourth n-type transistor being connected together as the second inverter output node.

10. The voltage controlled oscillator of claim 7, wherein the transformer comprises an autotransformer.

11. The voltage controlled oscillator of claim 7, wherein the capacitive element comprises a first capacitor bank and a second capacitor bank, the first capacitor bank comprising analog-tunable capacitors, the second capacitor bank comprising discretely-controlled capacitors.

12. A method comprising:

outputting a first voltage from a first inverter to a first node of an inductive-capacitive (LC) tank, the LC tank comprising a capacitive portion and a primary winding portion of a transformer, the capacitive portion being connected between the first node and a second node of the LC tank, the primary winding portion being connected between the first node and the second node;

inputting a second voltage from a third node to a first input node of the first inverter, a first secondary winding portion of the transformer being connected between the second node and the third node; and inputting a third voltage from the second node to a second input node of the first inverter.

13. The method of claim 12, wherein the first voltage oscillates.

14. The method of claim 12, comprising transforming voltage in the transformer between the primary winding portion and the first secondary winding portion.

15. The method of claim 12 further comprising:

outputting a third voltage from a second inverter to the second node; and inputting a fourth voltage from a fourth node to a second input node of the second inverter, a second secondary winding portion of the transformer being connected between the first node and the fourth node.

16. The method of claim 15, comprising:

transforming voltage in the transformer between the primary winding portion and the first secondary winding portion; and transforming voltage in the transformer between the primary winding portion and the second secondary winding portion.

17. The method of claim 15, wherein the transformer comprises an autotransformer that includes the primary winding portion, the first secondary winding portion and the second secondary winding portion.

18. The method of claim 12 further comprising controlling a resonance frequency of the LC tank by at least one of:

controlling switches in the capacitive portion to selectively couple capacitors to the LC tank; or tuning analog-tunable capacitors in the capacitive portion.

\* \* \* \* \*